United States Patent
Ishikawa et al.

(10) Patent No.: US 7,983,636 B2
(45) Date of Patent: Jul. 19, 2011

(54) AMPLIFIER CONTROL DEVICE

(75) Inventors: Hiroyoshi Ishikawa, Kawasaki (JP); Nobukazu Fudaba, Kawasaki (JP); Hajime Hamada, Kawasaki (JP); Kazuo Nagatani, Kawasaki (JP); Yasuhito Funyu, Kawasaki (JP); Norio Tozawa, Kawasaki (JP); Tokuro Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/642,254

(22) Filed: Dec. 18, 2009

(65) Prior Publication Data

US 2010/0148864 A1 Jun. 17, 2010

Related U.S. Application Data

(62) Division of application No. 11/589,898, filed on Oct. 31, 2006, now Pat. No. 7,664,473.

(30) Foreign Application Priority Data

Jun. 28, 2006 (JP) .................. 2006-178493

(51) Int. Cl.
*H01Q 11/12* (2006.01)
*H04K 3/00* (2006.01)

(52) U.S. Cl. .............. 455/127.1; 455/126; 330/285; 330/296

(58) Field of Classification Search ............ 455/126, 455/127.1–127.4; 330/130, 141, 285, 296
See application file for complete search history.

(56) References Cited

U.S. PATENT DOCUMENTS

| | | | |
|---|---|---|---|
| 3,900,823 A * | 8/1975 | Sokal et al. | 330/149 |
| 5,144,258 A | 9/1992 | Nakanishi et al. | |
| 5,406,225 A | 4/1995 | Iida | |
| 5,438,298 A | 8/1995 | Hori | |
| 5,896,064 A | 4/1999 | Kaku | |
| 2002/0168025 A1 | 11/2002 | Schwent | |

FOREIGN PATENT DOCUMENTS

| | | |
|---|---|---|
| JP | 04-079406 | 3/1992 |
| JP | 05-129860 | 5/1993 |
| JP | 09-331222 | 12/1997 |
| JP | 10-023089 | 1/1998 |
| JP | 2003-338712 | 11/2003 |
| WO | 9921293 A1 | 4/1999 |
| WO | 0027038 A | 5/2000 |

OTHER PUBLICATIONS

Non-Final Office Action dated Jun. 10, 2009 received in U.S. Appl. No. 11/589,898.
Notice of Allowance dated Nov. 19, 2009 received in U.S. Appl. No. 11/589,898.

(Continued)

*Primary Examiner* — Lee Nguyen
(74) *Attorney, Agent, or Firm* — Murphy & King, PC

(57) ABSTRACT

A bias control signal generation unit detects ON and OFF of a transmission signal input to an amplifier and having a property of a burst according to burst information. The bias control signal generation unit controls a bias voltage to be applied to an amplifier such that an idle current flowing through the amplifier can be flowing in a larger amount in a transmission OFF period, and can return to a normal level in a transmission ON period.

5 Claims, 31 Drawing Sheets

OTHER PUBLICATIONS

Extended European Search Report issued Feb. 23, 2009 in corresponding EP Patent Application 06022664.
Extended European Search Report issued May 7, 2009 in corresponding EP Patent Application 060226644.4.
Becker R. et al: "SP 22.4: PRAM—A Power Ramping Controller for TDMA Systems in Digital Mobile Telecom Applications" IEEE International Solid State Circuits Conference, IEEE Service Center, New York, NY, US, vol. 40, Feb. 1, 1997, p. 3701371, XP000753138 ISSN: 01 93-6530.
Japanese Office Action dated Aug. 10, 2010 corresponding to Japanese Application No. 2006-178493.

* cited by examiner

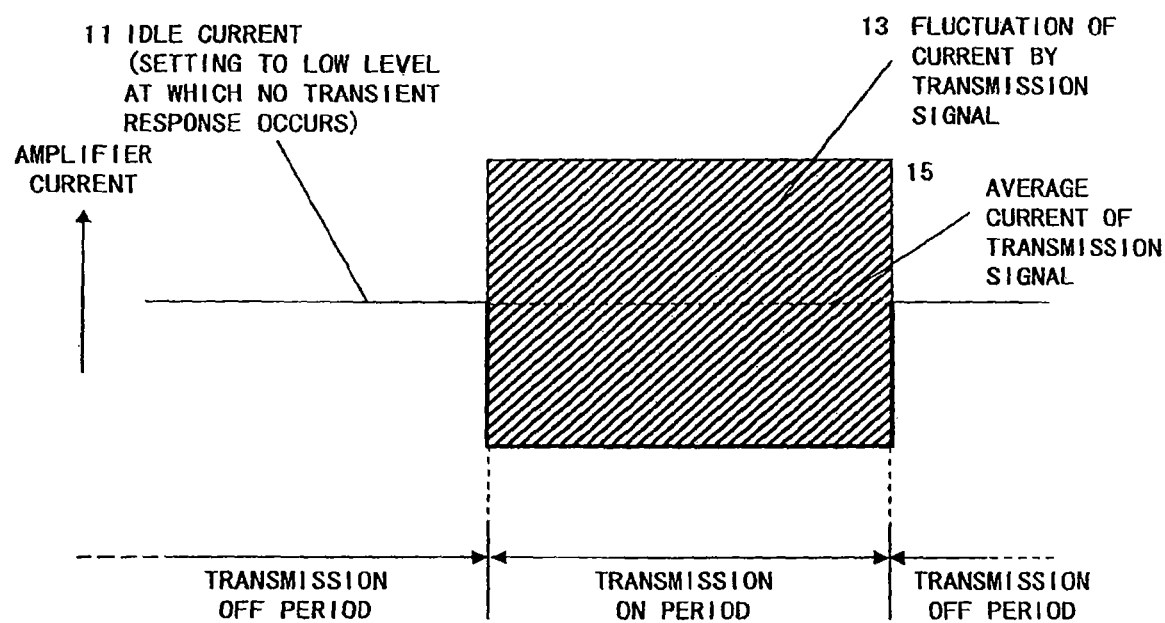
F I G. 4

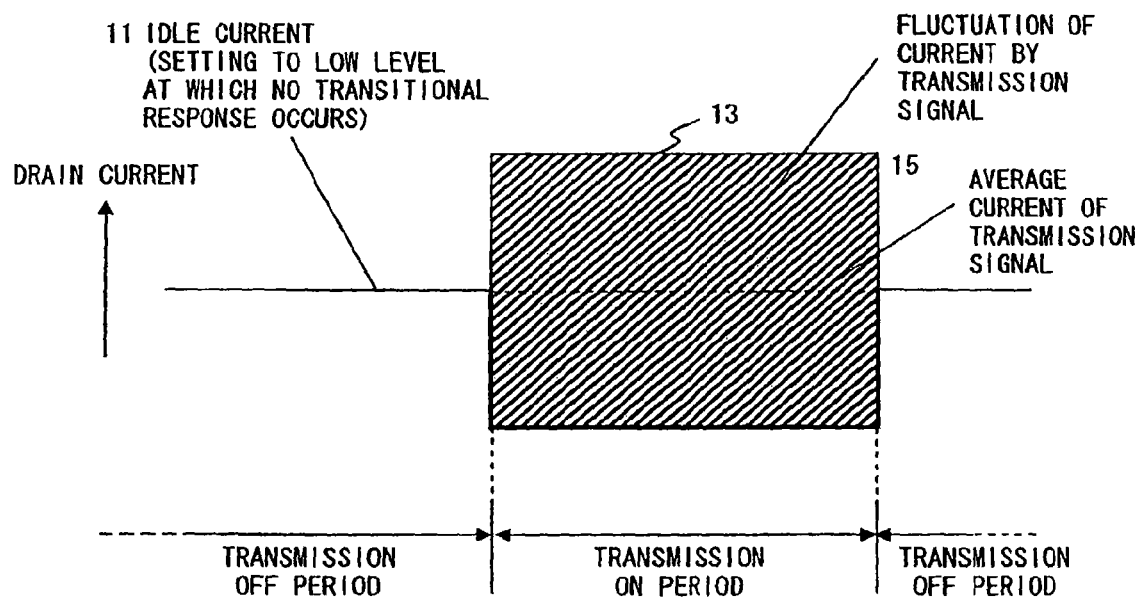
F I G. 6

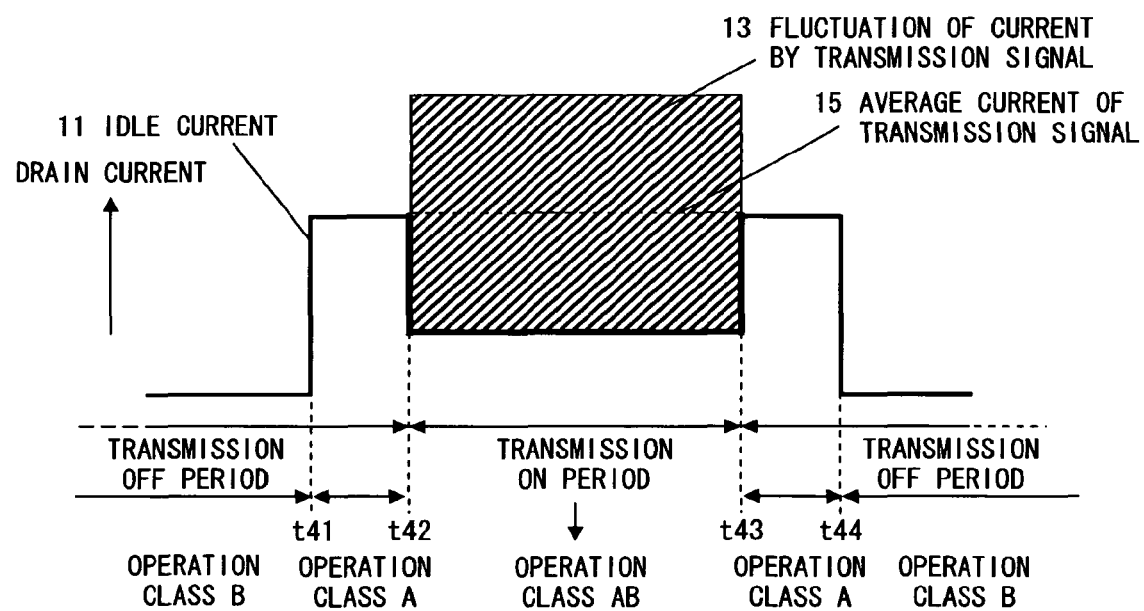
F I G. 1 3

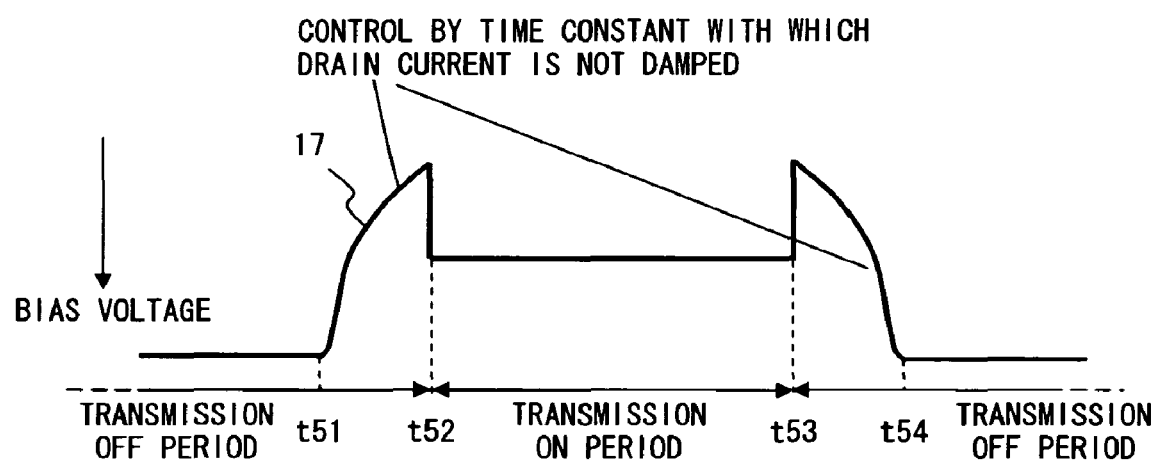
F I G. 1 4

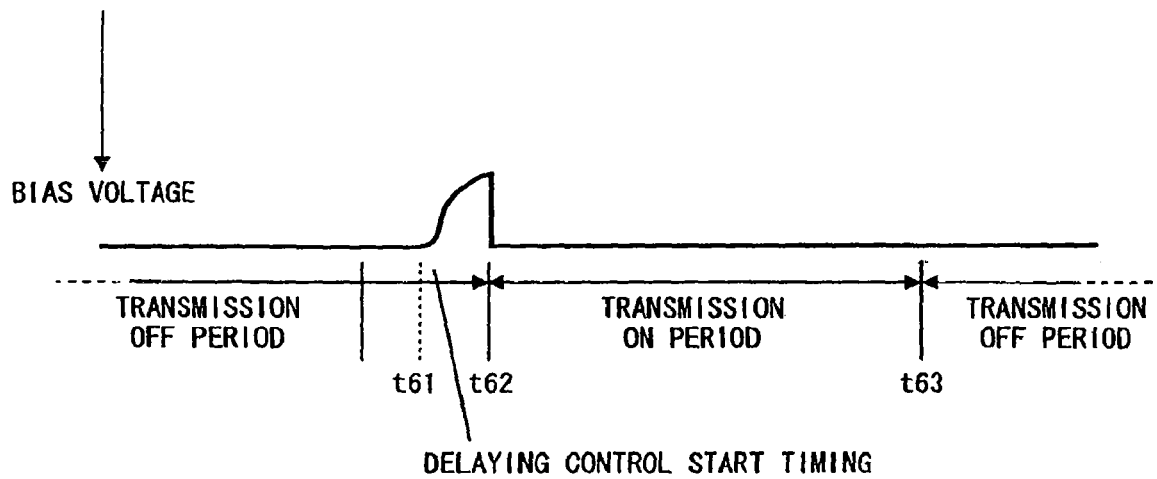
F I G. 1 6

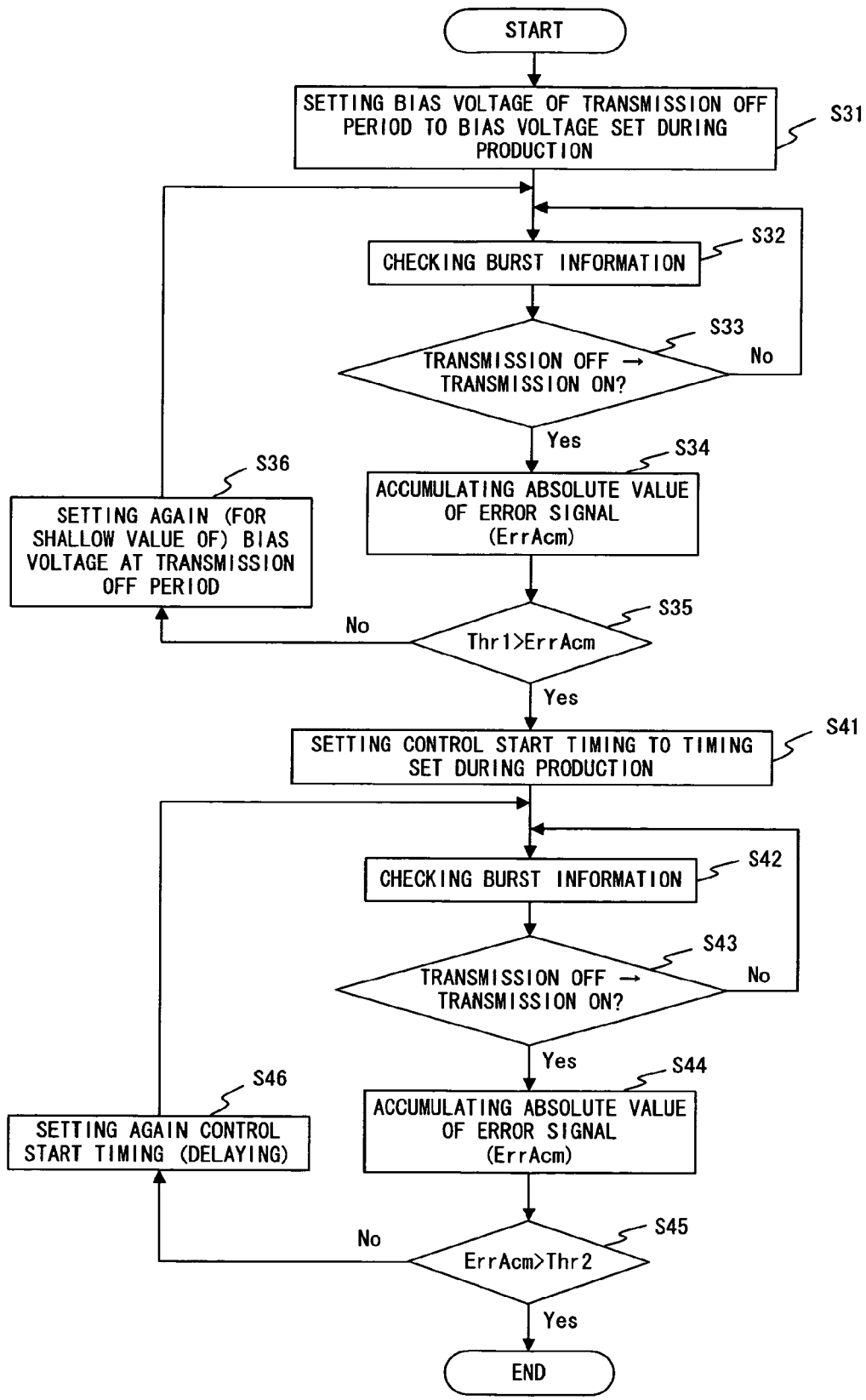
F I G. 3 1

AMPLIFIER CONTROL DEVICE

CROSS-REFERENCE TO RELATED APPLICATIONS

This application is a divisional of application Ser. No. 11/589,898, filed Oct. 31, 2006, now U.S. Pat. No. 7,664,473, issued Feb. 16, 2010, which is incorporated-by-reference herein in its entirety.

BACKGROUND OF THE INVENTION

1. Field of the Invention

The present invention relates to an amplifier and more specifically to a control device of an amplifier for amplifying a signal having a property of a burst.

2. Description of the Related Art

FIG. 1 shows an image of a signal (burst signal) having a property of a burst. As shown in FIG. 1, a burst signal is placed in a transmission ON status after a transmission OFF period, and placed in the transmission OFF status again after the transmission ON period. The transmission ON period starts in a burst manner.

When a TDD (time division duplex) signal, etc. having a property of a burst is power-amplified by an amplifier, a distortion (over shoot) occurs on an amplified signal by the transient response of an amplifier power supply system immediately after the signal is input (transmission ON period) as shown in FIG. 2. When a burst signal is switched from the transmission ON status to the transmission OFF status, a distortion (under shoot) occurs on an amplified signal by the transient response of an amplifier power supply system as shown in FIG. 2.

The distortion of the amplification output signal of the amplifier incurs the degradation of a transmission signal, and appears as a power leak to the outside of the frequency band of the transmission signal, that is, the degradation of an ACLR (adjacent channel leakage ratio) characteristic, thereby indicating an interference signal to a adjacent channel.

Normally, when an amplifier is used with high power efficiency, it is necessary to operate an amplifier by a high bias setting. At this time, a low idle current flows through the amplifier during a no signal period. In this status, when a transmission signal is suddenly input (when the signal is suddenly placed in the transmission ON status), the current of the amplifier flows at a high speed. The sudden current change allows the power supply system to indicate a transient response, consequently changes the amplifier characteristic, and incurs the distortion of the amplification signal of the amplifier.

FIG. 3 shows a change in the current flowing through the amplifier when a transmission signal having a property of a burst is placed in the transmission ON or OFF status.

When the transmission signal is in the transmission OFF period, an idle current 111 flows through the amplifier. In the transmission ON period, the current flowing through the amplifier fluctuates in the range of a hatch rectangle 113 shown in FIG. 3, and an average of a current (average current of a transmission signal) 115 indicated by the broken lines shown in FIG. 3.

One of the methods for reducing the distortion generated when a TDD signal, etc. having a property of a burst is amplified can be a technique of performing a ramping process on an amplifier input signal (refer to, for example, Japanese Published Patent Application No. H5-129860, Japanese Published Patent Application No. H10-23089, etc.). In these techniques, a variable ATT (variable attenuator) is performed at a stage preceding the amplifier, and a burst signal is gradually boosted (or attenuated).

When the ramping process is performed on the amplifier input signal using the variable ATT, and the distortion of the amplifier amplification signal due to the property of a burst, the amplitude of the amplifier input signal is directly processed. This refers to changing and outputting a transmission signal, thereby degrading signal quality.

SUMMARY OF THE INVENTION

The present invention aims at preventing a distortion when a signal is placed in an ON/OFF status in an amplifier for amplifying a signal having a property of a burst.

The present invention is based on the amplifier control device which is inputted a transmission signal with a property of a burst and performs amplification.

The first aspect of the present invention includes a control device for increasing the idle current of the amplifier in advance when a signal is placed in a transmission OFF status according to the information about the ON/OFF status of the transmission signal, and decreasing the idle current of the amplifier when the signal is placed in a transmission ON status.

According to the first aspect of the present invention, when a transmission signal having a property of a burst (hereinafter referred to as a burst signal) is switched from the transmission OFF status to the transmission ON status, a sudden change of the output current of the amplifier can be avoided. Therefore, the distortion (over shoot) of the output signal of the amplifier immediately after the switch can be suppressed.

The second aspect of the present invention is based on the first aspect. The control device controls the value of the idle current by controlling the bias voltage to be applied to the amplifier.

According to the second aspect of the present invention, the operation and the effect of the first aspect can be realized by controlling the bias voltage of the amplifier.

The third aspect of the present invention is based on the second aspect. The control device controls the bias voltage such that the idle current can be normally reduced when the transmission OFF status is entered, and the idle current can be increased only in the period immediately before the switch from the transmission OFF status to the transmission ON status.

According to the third aspect of the present invention, the power consumption of the amplifier in the transmission OFF status can be reduced. Therefore, the distortion of the output signal of the amplifier when the transmission ON/OFF status is switched can be reduced with higher power efficiency and lower power consumption.

The fourth aspect of the present invention is based on the third aspect of the amplifier control device. The control device controls the bias voltage such that an idle current can flow through the amplifier in the period immediately after the transmission ON status has been switched to the transmission OFF status.

According to the fourth aspect of the present invention, a sudden change of the output signal of the amplifier can be avoided when the transmission signal is switched from the transmission ON status to the transmission OFF status. Therefore, the problem of a sudden change of the output signal of the amplifier can be solved when a switch is made from the transmission ON status to the transmission OFF status. Therefore, the distortion (under shoot) of the output signal of the amplifier when the transmission ON/OFF status is performed can be suppressed.

The fifth aspect of the present invention is based on the third or fourth aspect. The control device controls the bias voltage in the period using a time constant for suppressing the damping of the output current of the amplifier immediately before entering the transmission ON status.

According to the fifth aspect of the present invention, an occurrence of a distortion of the output signal of the amplifier when the transmission OFF/ON status (attenuation of the transmission signal) or the transmission ON/OFF status (attenuation of the transmission signal) is switched can be suppressed without incurring the over shoot of the current (drain current when the amplifier is constituted by a FET (field effect transistor)) of the output signal of the amplifier.

The sixth aspect of the present invention is based on the third or fourth aspect of the amplifier control device. The control device determines the timing of increasing the idle current depending on the level of the transmission signal when the transmission ON status is entered. The level of the transmission signal can be, for example, the amplitude level, etc.

According to the sixth aspect of the present invention, the power consumption of the amplifier can be reduced by appropriately setting the idle current increase start control timing immediately before the switch of the transmission OFF/ON status depending on the level of the transmission signal when the transmission ON status is entered.

The seventh aspect of the present invention is based on the third or fourth aspect of the amplifier control device. The control device controls the bias voltage such that, when the transmission signal is continuously transmitted and the level of the transmission signal suddenly rises, the idle current flowing through the amplifier can increase with the rise of the level of the transmission signal immediately before the level fluctuates.

According to the seventh aspect of the present invention, although the level of the transmission signal suddenly rises when the transmission signal is continuously transmitted (when the transmission signal is continuously placed in the transmission ON status), the idle current is increased with the rise of the level of the transmission signal immediately before the change of the level. Therefore, the occurrence of the distortion of the output signal of the amplifier with the rise of the level of the transmission signal can be suppressed.

The eighth aspect of the present invention is based on the amplifier control device according to the fourth aspect. When the level of the transmission signal suddenly drops while the transmission signal is being transmitted, the control device controls the bias voltage such that the idle current flowing through the amplifier can decrease with the level of the transmission signal immediately after the level of the transmission signal fluctuates.

According to the eighth aspect of the present invention, although the level of the transmission signal suddenly drops while the transmission signal is being transmitted, the idle current flowing through the amplifier is decreased depending on the drop of the level of the transmission signal immediately after the change of the level. Therefore, the occurrence of the distortion of the output signal of the amplifier by the drop of the level of the transmission signal can be suppressed.

The ninth aspect of the present invention is based on the third or fourth aspect of the amplifier control device. The control device controls the bias voltage such that the operation point of the amplifier can gradually change at the point immediately before the transmission OFF status is switched to the transmission ON status and the point immediately after the switch.

According to the ninth aspect of the present invention, for example, the bias voltage is controlled such that the operation of the amplifier is gradually changed from a class B to a class A immediately before entering the transmission OFF/ON status, and the operation of the amplifier is gradually changed from class A to class AB immediately after entering the transmission ON status. The closer the amplifier is to the operation of class A, the higher the strength of the amplifier is to the property of a burst. Thus, the occurrence of the distortion of the output signal of the amplifier by the switch of the transmission OFF/ON status can be suppressed.

The tenth aspect of the present invention is based on the first aspect of the amplifier control device. The control device includes the following devices.

An attenuation device attenuates an output signal of the amplifier down to the level before amplification, and outputs the signal. An error signal accumulation value calculation device calculates the difference between the transmission signal and the signal output by the attenuation device as an error signal accumulation value when the transmission signal input to the amplifier is turned on from the OFF status. The bias control device controls the bias voltage to be applied to the amplifier based on the error signal accumulation value calculated by the error signal accumulation value calculation device.

According to the tenth aspect of the present invention, the output signal amplified by the amplifier is attenuated to the level before the amplification and feed back, the amount of the distortion of the output signal is checked based on the output signal and the signal before the amplification by the amplifier (transmission signal), and the bias voltage is controlled based on the amount of distortion. Therefore, the amount of distortion is directly detected and the bias voltage can be controlled and indicate an appropriate value.

Thus, since the bias voltage is controlled while monitoring the amount of distortion of the output signal of the amplifier, the occurrence of the distortion of the output signal of the amplifier when the transmission OFF/ON status is switched can be effectively suppressed.

According to the present invention, an amplifier for amplifying a signal having a property of a burst can remove the distortion occurring when the signal is turned ON/OFF.

BRIEF DESCRIPTION OF THE DRAWINGS

FIG. 4 shows the basic principle of the present invention.

FIG. 6 shows an example of the drain current of the amplifier in the transmission OFF status and the transmission ON status.

FIG. 13 shows an idle current flowing through the amplifier changing depending on the control of the bias voltage shown in FIG. 12.

FIG. 14 shows the method of controlling the bias voltage using a time constant without damping (over shoot and under shoot) of a drain current according to the embodiment 5 of the present invention.

FIG. 16 shows an example of setting a bias voltage according to the embodiment 6 of the present invention.

FIG. 31 shows the procedure of an example of the third configuration of the bias control signal generation unit according to the embodiment 10.

DETAILED DESCRIPTION OF THE INVENTION

A mode for embodying the present invention is explained below by referring to the attached drawings.

Principle of the Present Invention

The present invention adjusts the idle current of the amplifier flowing depending on the signal having a property of a burst (hereinafter referred to as a burst signal), and allows the amplifier to be tolerant to a burst. In the present invention, the bias voltage of an amplifier is operated to adjust the idle current of the amplifier.

FIG. 4 shows the basic principle of the present invention.

As shown in FIG. 4, to suppress the sudden fluctuation of the current of the amplifier when the ON/OFF status of a burst signal (transmission ON/OFF status) is switched, a large amount of idle current 11 flows through the amplifier when the transmission OFF status is entered, and the idle current 11 is returned to the original level when the transmission ON status is entered. This is a device for a smooth transfer of a change of the current of the amplifier. The level of the idle current 11 flowing through the amplifier when the transmission ON status is entered is set to a low level such that the transient response cannot occur when the transmission signal is switched ON/OFF. In the example shown in FIG. 1, the level of the idle current 11 is set to the same level as an average current 15 (broken lines shown in FIG. 1) in the burst signal transmission ON period. The average current 15 shown in FIG. 4 shows the fluctuation current range of the amplifier by the transmission signal flowing in the transmission ON period according to the present invention.

Figure 5:
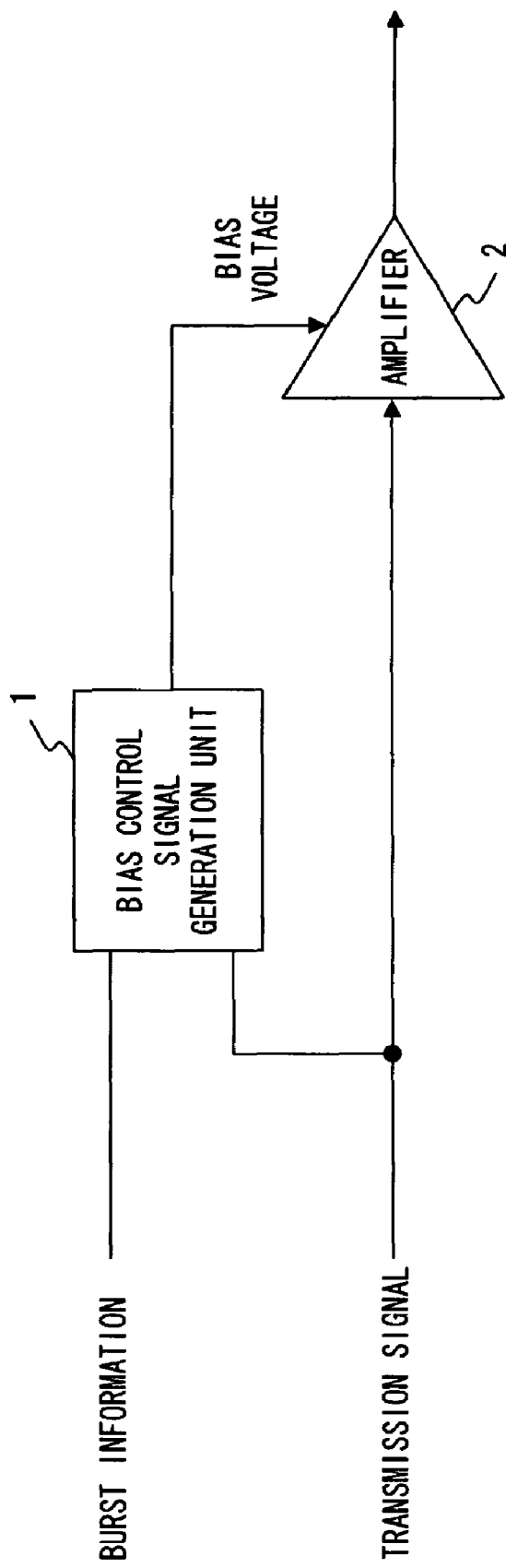
FIG. 5 shows an example of the configuration of the bias voltage control circuit of the amplifier according to the present invention.

FIG. 5 shows an example of the configuration of the bias voltage control circuit of the amplifier according to the present invention.

A bias control signal generation unit 1 inputs burst information and a transmission signal, and controls the bias voltage to be applied to an amplifier 2 based on them. The burst information relates to the ON/OFF status of a burst signal, and notifies the bias control signal generation unit 1 of, for example, "1" as the timing of the transmission signal ON status (transmission ON status), and "0" as the timing of the transmission signal OFF status (transmission OFF status). The bias control signal generation unit 1 detects the timing of switching the transmission signal to be input to the amplifier 2 to the ON or OFF status according, to the transmission signal or burst information. Additionally, the bias voltage is applied to the amplifier 2 to control the level of the idle current of the amplifier 2. The amplifier 2 amplifies and outputs the transmission signal.

Figure 1:
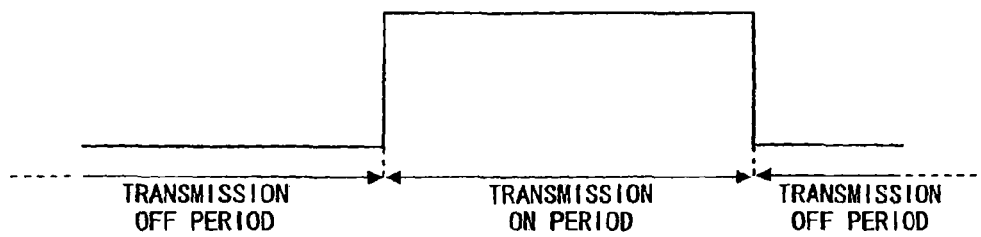
FIG. 1 shows an image of a signal having a property of a burst (burst signal).

In the circuit shown in FIG. 5, the bias control signal generation unit 1 controls the bias voltage to be applied to the amplifier 2 based on the burst information or the transmission signal, thereby realizing the control of the amplifier 2 as shown in FIG. 1.

Embodiment of the Present Invention

In the following embodiment, it is assumed that the amplifier for the power amplification is constituted by an FET (field effect transistor) element. The circuits according to the embodiments 2 through 8 are constituted as shown in FIG. 5.

Embodiment 1

The present embodiment makes the idle current value of an amplifier to change by placing the burst signal in the OFF status (hereinafter described as transmission OFF) and in the ON status (hereinafter described as transmission ON). At the transmission OFF, a larger amount of idle current of the amplifier flows, and at the transmission ON, a smaller amount of idle current of the amplifier flows.

FIG. 6 shows an example of the drain current of the amplifier in the transmission OFF status and the transmission ON status. The upward vertical axis shown in FIG. 6 indicates a drain current (same as in FIGS. 8, 11, 13, 15, 17, 18, and 20 through 22). The horizontal axis indicates time (same as in FIGS. 10 through 27).

In FIG. 6, a solid line 11 indicates a drain current, and a hatch portion 13 indicates a drain current of an amplifier fluctuating at the transmission ON. In the present embodiment, the level of the idle current 11 is set based on the transmission ON/OFF. For example, as shown in FIG. 6, the idle current at the transmission OFF is set to the average current (broken line 15 shown in FIG. 6) of the period (transmission ON period) in which the signal is transmitted.

In the present embodiment, the level of the idle current 11 at the transmission OFF is set to the average value of the drain current of the amplifier in the transmission ON period. From the point of view of the power consumption of an amplifier, it is desired that the idle current of the amplifier at the transmission OFF is set to the minimum level at which no transient response occurs. The idle current of the amplifier at the transmission OFF can be an effective value of the current flowing through the amplifier at the transmission ON, or can be determined depending on the signal level at the start of the transmission ON.

Embodiment 2

Figure 7:
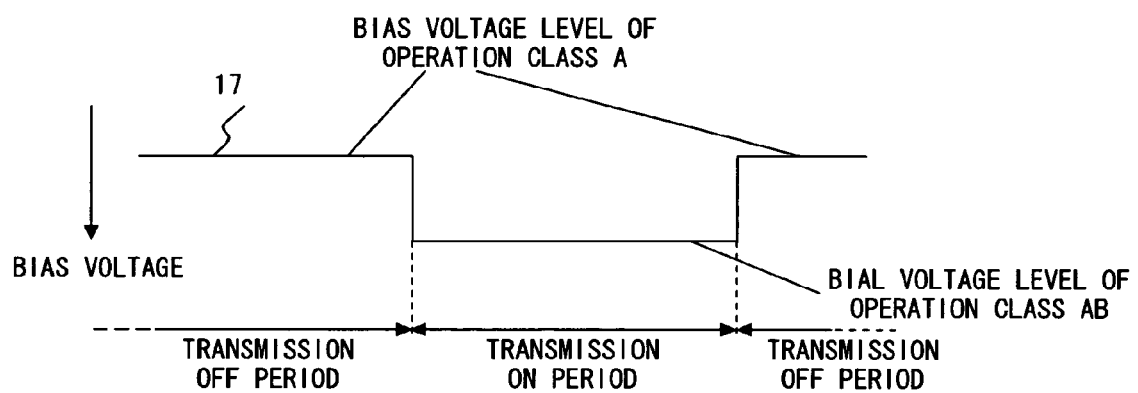
FIG. 7 shows an example of setting a bias voltage according to the embodiment 2 of the present invention.
Figure 8:
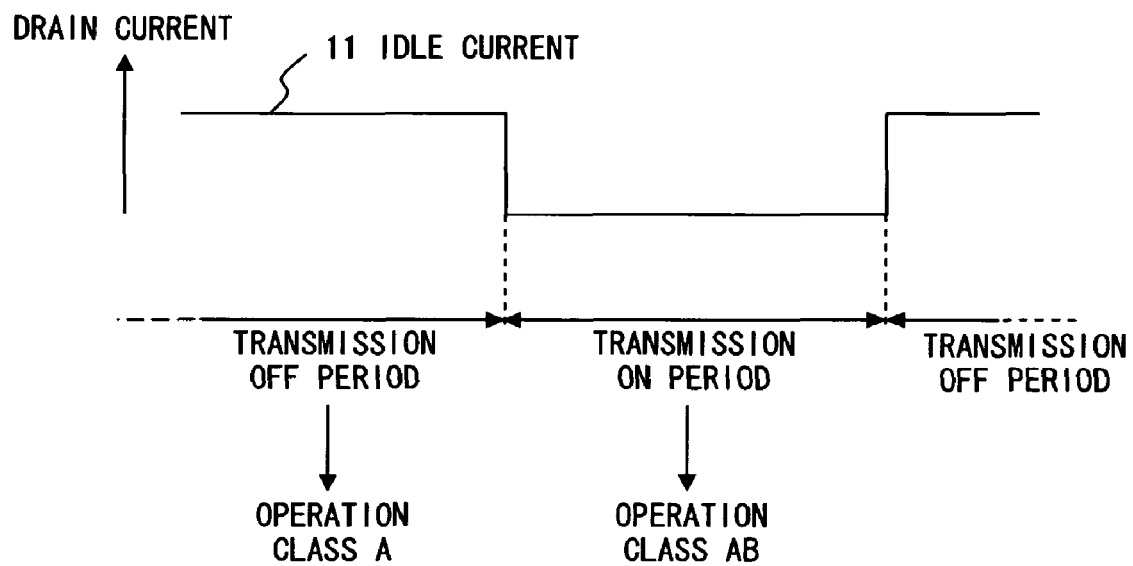
FIG. 8 shows a change of an idle current of the amplifier depending on the setting of the bias voltage shown in FIG. 7.

In the present embodiment, the bias voltage to be applied to an amplifier is controlled as a method of controlling the idle current of an amplifier. FIG. 7 shows an example of setting a bias voltage, and FIG. 8 shows a change of an idle current of the amplifier depending on the setting of the bias voltage shown in FIG. 7. The downward vertical axis shown in FIG. 8 shows a negative bias voltage (same as in FIGS. 10, 12, 14, 17, 19, 23, and 24). The circuit configuration according to the present embodiment can be shown, for example, in FIG. 5.

As shown in FIG. 7, a bias voltage 17 is controlled and set at a shallow level at the transmission OFF so that the amplifier 2 is close to class A operation. On the other hand, at the transmission ON, the bias voltage 17 is controlled and set at a deep level at the transmission ON so that the amplifier 2 is close to class AB operation.

Classes A and AB are the terms generally used for identification of classes depending on the operation point of a power amplifier. In the explanation of the embodiments in this specification, the operation points of an amplifier are expressed by classes A, AB, and B for easy of explanation. Therefore, the expression of classes is not important, and it is important to control an idle current. With a larger absolute value of a bias voltage (deeper setting), the operation of the amplifier 2 changes in classes A, AB, and B.

By the bias voltage control shown in FIG. 7, the idle current 11 flowing through the amplifier 2 is controlled as shown in FIG. 8. That is, the idle current 11 increases at the transmission OFF, and decreases at the transmission ON. Therefore, the burst signal is moderately boosted when it is switched from the transmission OFF to the transmission ON, and the distortion (over shoot) of the output signal of the amplifier 2 is suppressed. Similarly, when it is switched from the transmission OFF to the transmission ON, the burst signal is moderately attenuated, and the distortion (under shoot) of the output signal of the amplifier 2 is suppressed.

Embodiment 3

The control of the idle current according to the embodiment 2 is disadvantageous in power efficiency of the amplifier 2. In the non-signal status (transmission OFF period), a large amount of idle current flows constantly. Therefore, it is the waste of power. In the present embodiment (embodiment 3), the operation point of an amplifier in the transmission OFF period is controlled as shown in FIG. 9.

Figure 9:
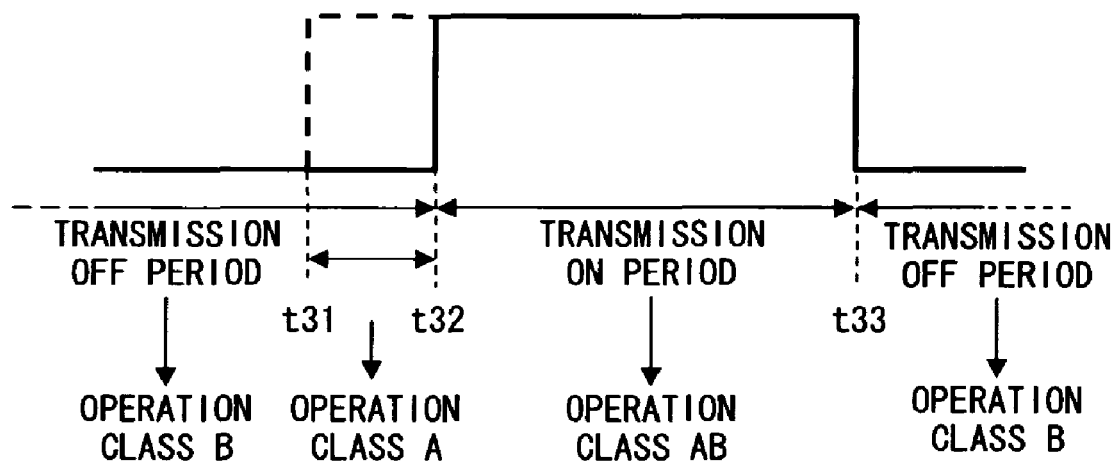
FIG. 9 shows an example of a change of an operation point of the amplifier according to the embodiment 3 of the present invention.

FIG. 9 shows an example of a change of an operation point of the amplifier 2. As shown in FIG. 9, the operation of an amplifier is made to be closer to class A immediately before the transmission ON (time t31), and the amplifier 2 is set for the operation class B in which no idle current flows (logically 0) in other transmission OFF period (before time t31 inclusive and after time t33 inclusive). In the transmission ON period (time t32 to t33), the amplifier is operated in class AB.

Figure 10:
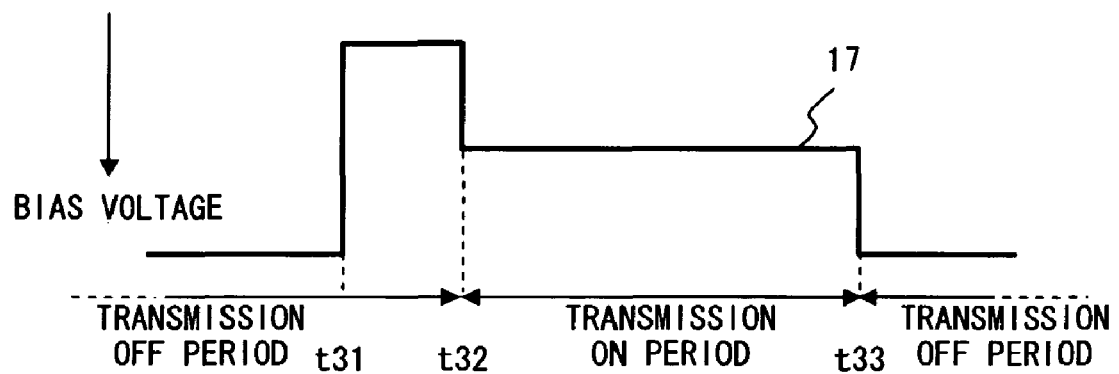
FIG. 10 shows an example of setting the bias voltage of the amplifier in the method shown in FIG. 9.

FIG. 10 shows an example of setting the bias voltage of the amplifier 2 in the method shown in FIG. 9. As shown in FIG. 10, the bias voltage 17 is set at a deep level in the transmission OFF period (before time t31 inclusive), and the amplifier 2 is operated in class B. Immediately before the transmission ON (time t31), the bias voltage to be applied to the amplifier 2 is reduced and controlled such that the amplifier 2 can operate in class A. When the transmission ON status is entered at time t32, the bias voltage 17 is set at the level at which the amplifier 2 can be operated in class AB, and the bias voltage 17 is maintained during the transmission ON (time t32 to t33). When the transmission OFF status is entered at the time t33, the bias voltage 17 is set such that the amplifier 2 can operate in class B again.

Figure 11:
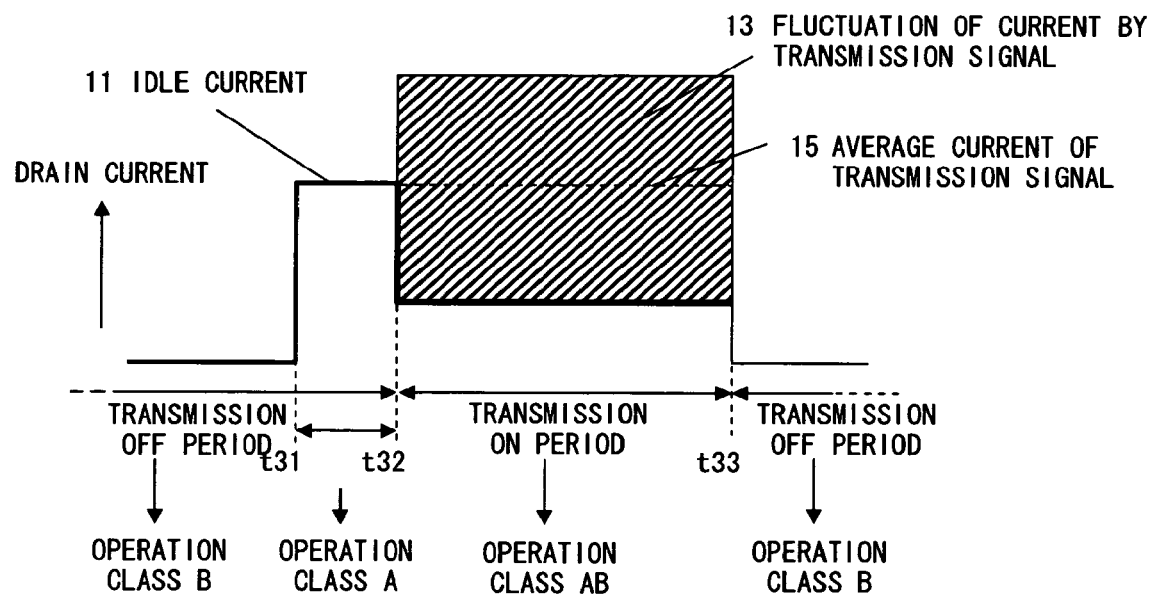
FIG. 11 shows a change of an idle current flowing through an amplifier when an amplifying operation is performed as shown in FIG. 9.

FIG. 11 shows a change of an idle current flowing through an amplifier 2 when an amplifying operation is performed as shown in FIG. 9. In the example shown in FIG. 8, the level of the idle current 11 immediately before the transmission ON (time t31) is set equal to the average current 15 of the transmission signal flowing through the amplifier 2 in the transmission ON period (time t32 to t33).

Thus, in the embodiment 3, in the transmission OFF period (before time t31 inclusive), the amplifier 2 is operated in class B and the operation of the amplifier is made to be close to the operation in class A only immediately before the transmission ON (time 32), the power efficiency of an amplifier is advantageous over the embodiment 2.

Embodiment 4

In the present embodiment, a change of an operation point of an amplifier made in the embodiment 3 is also performed when a switch from the transmission ON to the transmission OFF is performed. As described above, when the switch is performed to the transmission OFF, an under shoot of an amplifier power supply system occurs, which appears as a distortion in the signal after the amplification of the amplifier. When a switch from the next transmission OFF to the transmission ON occurs in a short period, the influence of the transient response of an amplifier power supply system appears and generates a distortion in the amplification signal. The present embodiment suppresses the distortions of the amplification signal of an amplifier.

Figure 12:
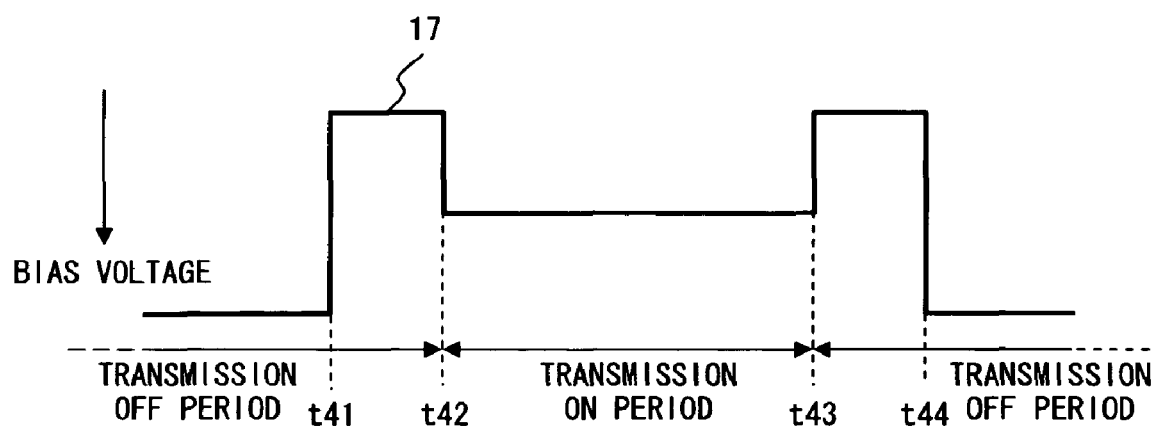
FIG. 12 shows an example of setting a bias voltage for changing an amplifier operation point according to the embodiment 4 of the present invention.

FIG. 12 shows an example of setting a bias voltage for changing the amplifier operation point. In the present embodiment, to the bias voltage setting control of the embodiment 3, the control of setting a bias voltage at a shallow level immediately after the switch from the transmission ON to the transmission OFF (at time t43), and setting a bias voltage at a deep level after passing a predetermined period is added. In this example, when the switch is performed from the transmission ON to the transmission OFF at time t43, the bias voltage 17 is controlled such that the waveform of the bias voltage 17 can be symmetrical with the waveform of the bias voltage 17 immediately before the switch from the transmission OFF to the transmission ON (at time t42).

Depending on the control of the bias voltage shown in FIG. 12, the idle current 11 flowing through the amplifier 2 changes as shown in FIG. 13. Immediately before the transmission ON/OFF (time t41 to t42) and immediately after the switch transmission OFF/ON (time t43 to t44), the idle current 11 rises. In the period other than the above-mentioned period, (in the transmission OFF period), no idle current 11 flows (operation in class B).

In the case of the present embodiment, as compared with the embodiment 3, while the power consumption increases, the problem of an under shoot occurring at the transmission ON/OFF switch can be solved.

Embodiment 5

In the control of the idle current in the above-mentioned embodiments, there is the possibility of an over shoot of a drain current. In the present embodiment, as shown in FIG. 14, the bias voltage 17 is controlled using a time constant without damping of a drain current (over shoot and under shoot). In the present embodiment, the control is performed before the switch from the transmission OFF to the transmission ON (time t51 to t52) and after the switch from the transmission ON to the transmission OFF (time t53 to t54).

Figure 15:
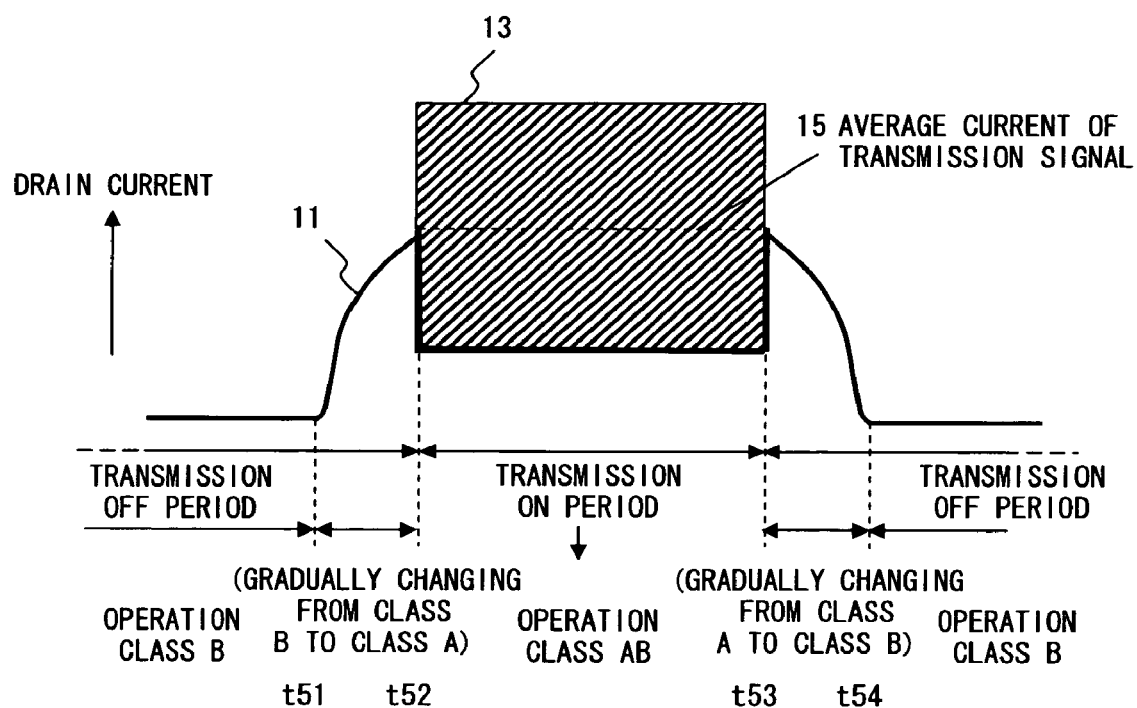
FIG. 15 shows a change of a drain current flowing through the amplifier when the bias voltage is controlled as shown in FIG. 14.

As shown in FIG. 14, when the bias voltage 17 is controlled, a change of the drain current (idle current 11) of the amplifier 2 is made as shown in FIG. 15. Immediately before the switch from the transmission OFF to the transmission ON (time t51 to t52), the amplifier 2 operates such that the operation gradually changes from class B to class A. Immediately after the switch from the transmission ON to the transmission OFF (time t53 to t54), the amplifier 2 operates such that the operation gradually changes from class A to class B.

In the embodiment, the control of the bias voltage is performed before the switch from the transmission OFF to the transmission ON and after the switch from the transmission ON to the transmission OFF. However, the bias voltage can also be controlled only immediately before the switch from the transmission ON to the transmission OFF.

Embodiment 6

In the present embodiment, the control timing of the drain current is changed depending on the level (amplitude level or power level) of the signal at the transmission ON to minimize the power consumption by reducing the flow of a wasteful idle current.

Figure 17:
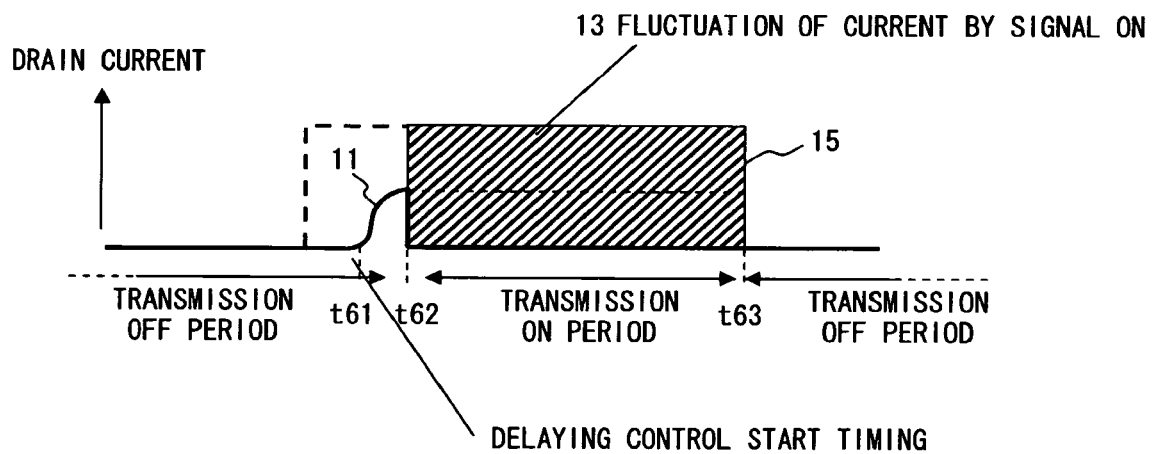
FIG. 17 shows the control timing of the idle current depending on the level of the transmission signal in the bias voltage setting control shown in FIG. 16.

FIG. 16 shows an example of setting a bias voltage according to the present embodiment. FIG. 17 shows the control timing of the idle current depending on the level of the transmission signal by controlling the setting of the bias voltage.

In the present embodiment, as shown in FIG. 16, the control of the bias voltage 17 is started immediately before (time t61) the switch from the transmission OFF to the transmission ON and delays the control timing of the drain current. The hatch portion 13 shown in FIG. 17 indicates the fluctuation of the current in the transmission ON period (time t62 to t63) by the signal ON at the time t62. The bias voltage is controlled such that the idle current 11 of the amplifier 2 can be equal to the average current 15 of the transmission signal of the amplifier in the transmission ON period at the time t62 of the transmission ON. FIG. 17 shows an example of the control when signal power is low. When the level of the transmission signal is larger, the control timing of the drain current is shortened. If the transmission signal is high, the transient response of the amplifier power supply system is strong. Therefore, it is necessary to raise the idle current at an earlier stage. However, since there are less transient responses when the transmission signal is low, the control start timing is delayed.

According to the present embodiment, an idle current is controlled only immediately before the switch of the transmission signal from OFF to ON, but the idle current can also be controlled also immediately after the switch of the transmission signal from ON to OFF. In this case, the waveform of an idle current is obtained by inverting the idle current immediately before the switch (with the axis parallel to the drain current set at the center).

The waveform of the idle current can also be the waveform according to the embodiments 3 and 4.

Embodiment 7

Figure 18:
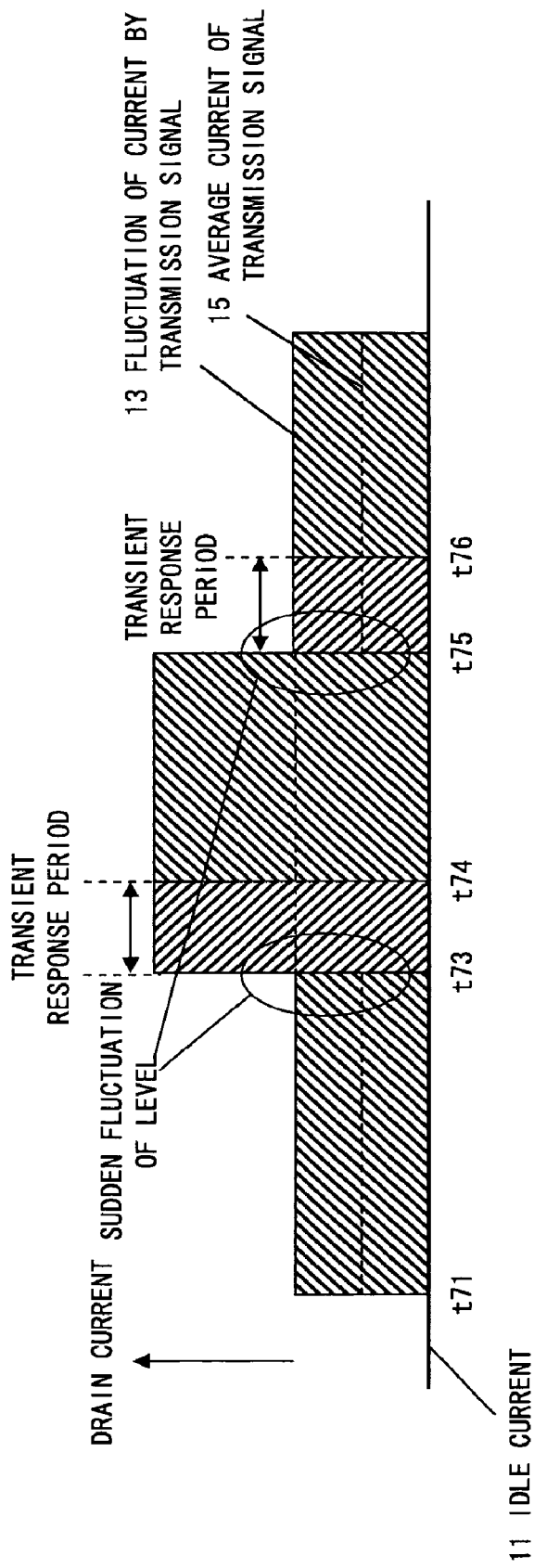
FIG. 18 shows a sudden fluctuation of a signal when signals are constantly transmitted.

As shown in FIG. 18, although a signal is constantly transmitted, the level of the transmission signal can be suddenly changed. Even in this case, the present embodiment can suppress the distortion of the amplifier output signal by the transient response of the amplifier power supply system.

In the example shown in FIG. 18, at the time t71 and t73, the transmission signal suddenly fluctuates. Therefore, a transient response of an amplifier power supply system occurs in the period (first transient response period) at the time t71 and t72 and the period (second transient response period) at the time t73 to t74. Therefore, there occurs a distortion in the output signal of the amplifier 2 in the first and second transient response periods.

Figure 19:
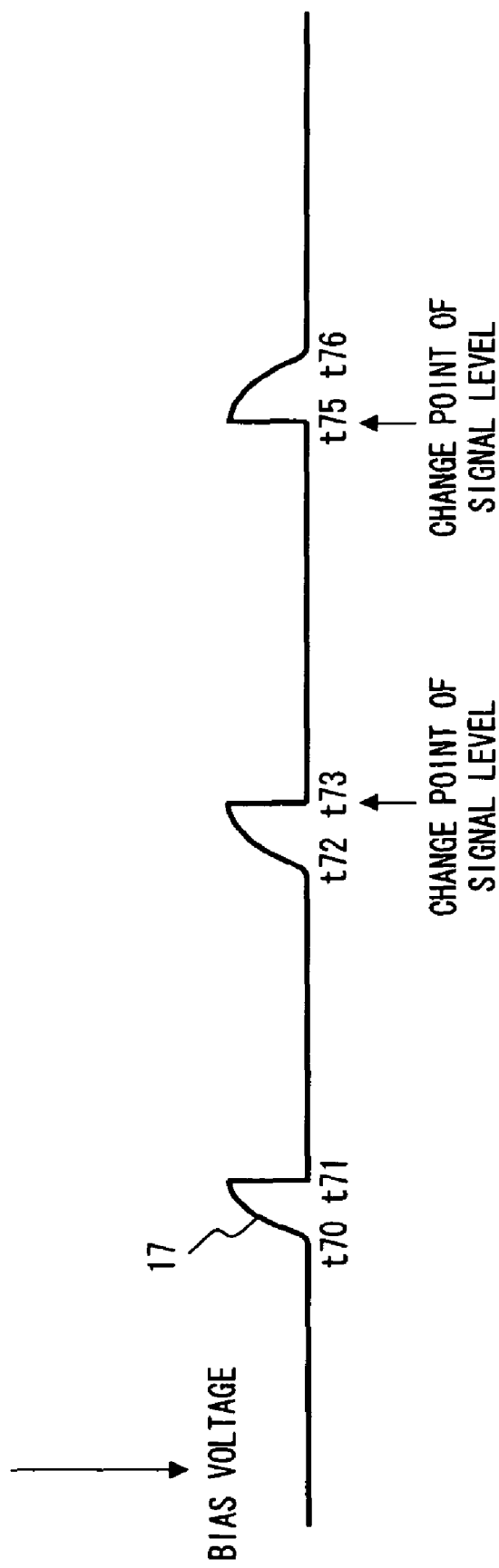
FIG. 19 shows the method of controlling a bias voltage in the embodiment 7 of the present invention.

The present embodiment controls the bias voltage to be applied to the amplifier 2 to prevent a distortion of an output signal of the amplifier 2 from being generated between the transient response periods. In the present embodiment, to respond to the transient response shown in FIG. 18, the bias voltage control as shown in FIG. 19 is performed. The bias voltage control is based on the embodiment 6.

Figure 20:
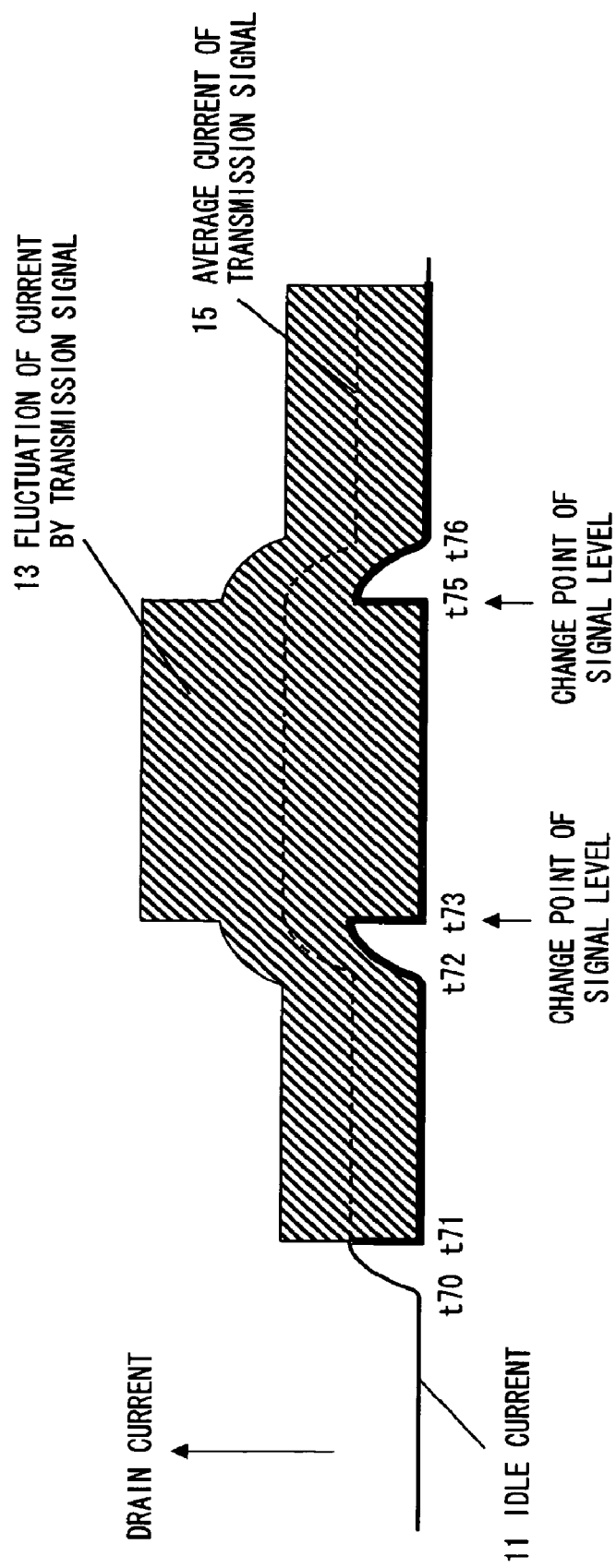
FIG. 20 shows a change of a drain current flowing through the amplifier when the bias voltage is controlled as shown in FIG. 19.

In the present embodiment, the bias control signal generation unit 1 detects a change point of the transmission signal based on an input transmission signal, and applies to the amplifier 2 the bias voltage 17 at the timing depending on the level of the transmission signal immediately before the change point (time t70 to t71, time t72 to t73, and time t75 to t76) as shown in FIG. 19. Thus, the drain current flowing through the amplifier 2 (idle current 11) increases in accordance with the bias voltage as shown in FIG. 20. Thus, in an operation similar to the operation according to the embodiment 5, the problem of the distortion of the output signal of the amplifier 2 due to the transient response of the power supply system of the amplifier 2 at the change point of the signal level.

Embodiment 8

The closer to the operation in class A, an amplifier is the more tolerant to a burst because, since the idle current is originally high when it is operated in class A, the difference in drain current occurring by a switch of the signal ON/OFF is not large. Therefore, there is a case where class can be gradually switched from A to AB although class is not switched to class AB immediately after the switch ON of the signal.

Figure 21:
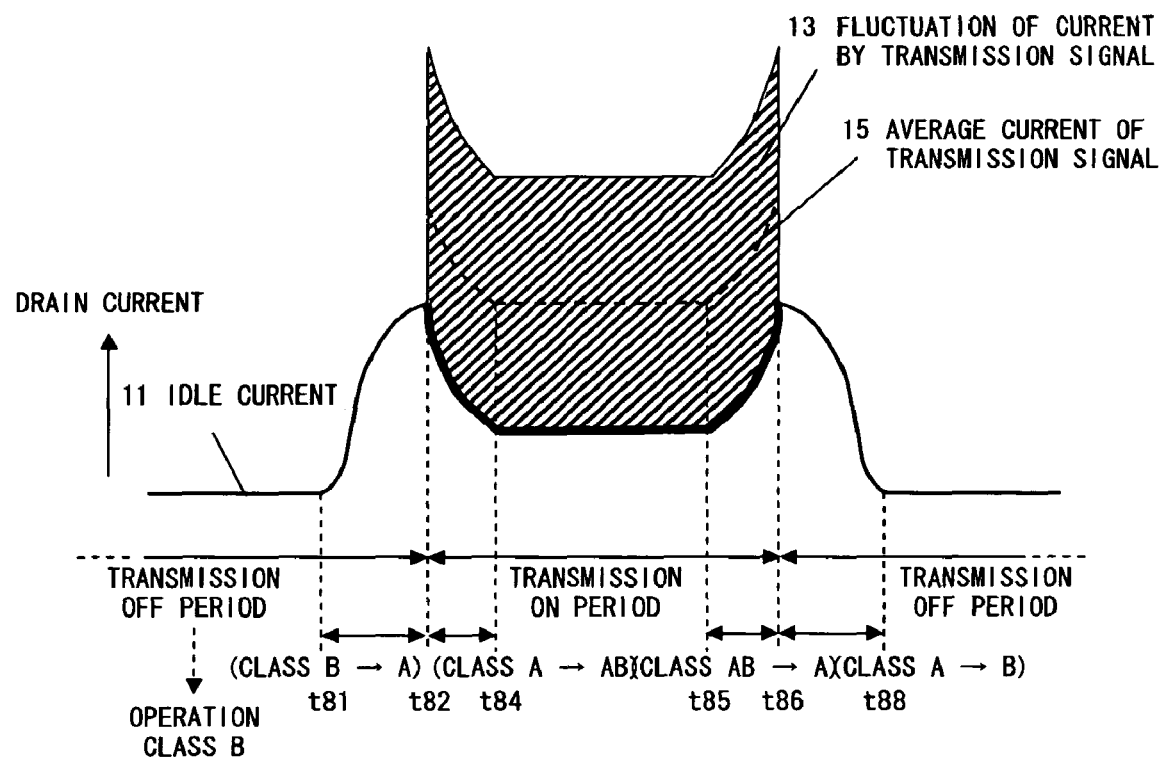
FIG. 21 shows an image of the method (1) of controlling an idle current according to the embodiment 8 of the present invention.
Figure 22:
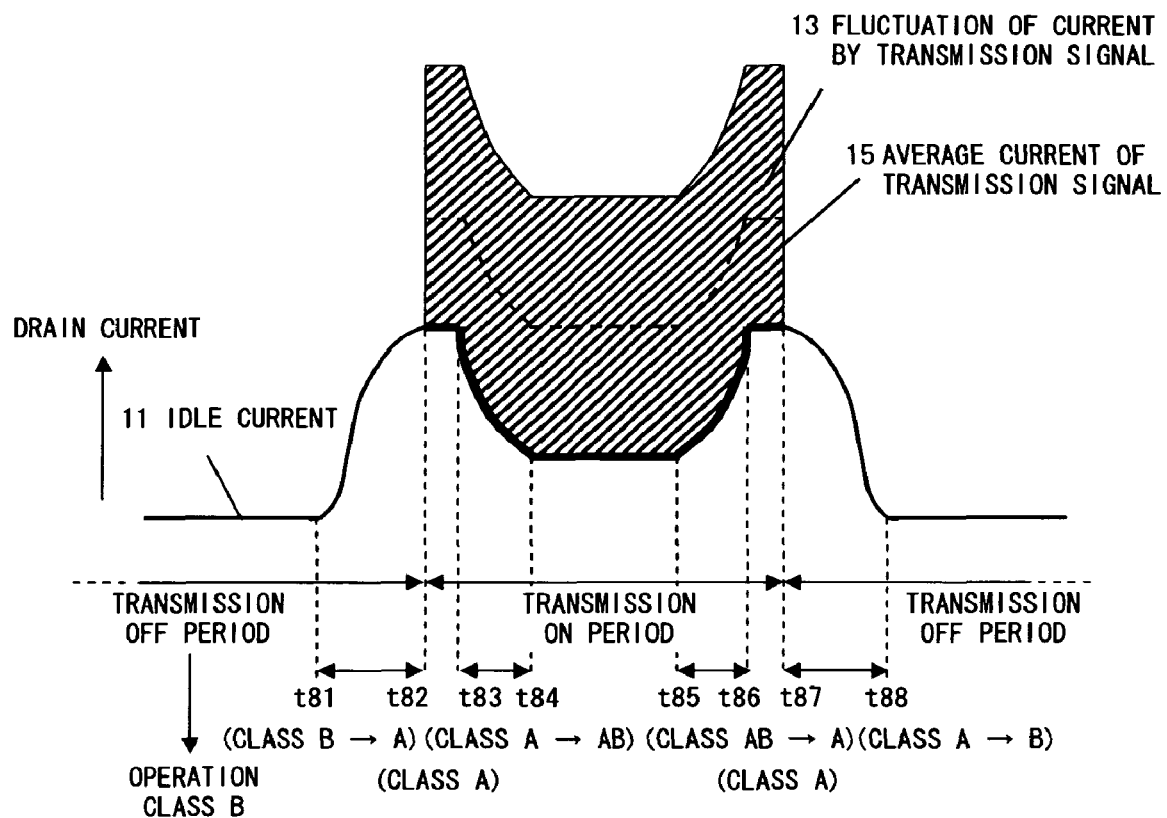
FIG. 22 shows an image of the method (2) of controlling an idle current according to the embodiment 8 of the present invention.

FIGS. 21 and 22 show images of the method of controlling an idle current according to the present embodiment.

In the method shown in FIG. 21 (first method), the amplifier 2 is operated in class B in the transmission OFF period (before the time t81 inclusive). Then, before entering the transmission ON status (time t81 to t82), a change from class B to class A is made, and after the transmission ON (time t82 to t83), a change from class A to class AB is made. At the switch from the transmission ON to the transmission OFF, the control is performed in the inverse order. That is, the operation of the amplifier 2 is gradually changed from class AB to class A (time t85 to t86), and from class A to class B (time t86 to t87).

In the method (second method) shown in FIG. 22, a period in which the amplifier 2 is operated in class A is provided immediately after the transmission ON (time t82 to t83) and immediately before the transmission OFF (time t86 to t87). With the period, it is easier to perform timing control in the method shown in FIG. 22 than in the method shown in FIG. 21.

Figure 23:
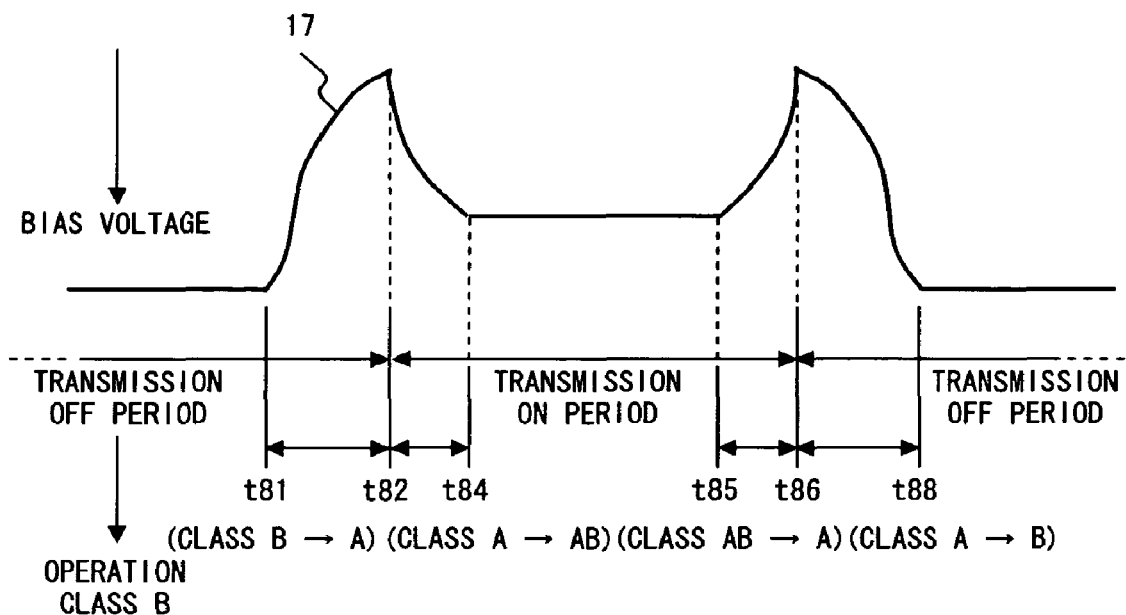
FIG. 23 shows the method of controlling the bias voltage to be added to the amplifier for controlling the idle current shown in FIG. 21.
Figure 24:
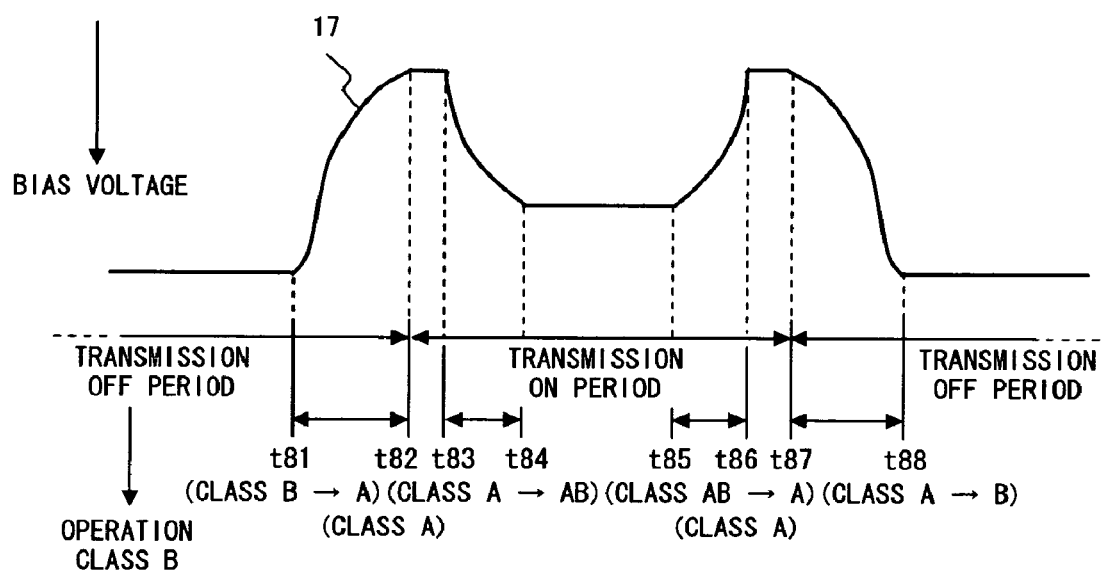
FIG. 24 shows the method of controlling the bias voltage to be added to the amplifier 2 for controlling the idle current shown in FIG. 21.

FIGS. 23 and 24 show the methods of controlling the bias voltage 17 to be added by the bias control signal generation unit 1 to the amplifier 2 for controlling the idle current shown in FIGS. 21 and 22.

In the present embodiment, the idle current is controlled when a transmission signal is boosted (transmission OFF→transmission ON) and when it is attenuated (transmission ON→transmission OFF), but the idle current can also be controlled only when the transmission signal is boosted.

Embodiment 9

In the present embodiment, the output signal of an amplifier when the burst signal is boosted or attenuated is analyzed, and the bias voltage to be applied to the amplifier is controlled such that the amount of distortion of the output signal (the amount of over shoot component or under shoot component) can be lower than a predetermined value. In analyzing an output signal, the transmission signal is compared with an output signal (amplification signal of the transmission signal) of an amplifier, and calculates the difference between the signals as an amount of distortion. Since the output signal of an amplifier is obtained by amplifying an input transmission signal, the output signal of the amplifier is attenuated to the original level (level before the amplification) based on the gain of the amplifier when the amount of distortion if calculated, and the attenuated output signal is compared with the transmission signal, thereby obtaining the amount of distortion. Also in the above-mentioned embodiment 10, the amount of distortion of the output signal of an amplifier is calculated in a similar method.

Figure 25:
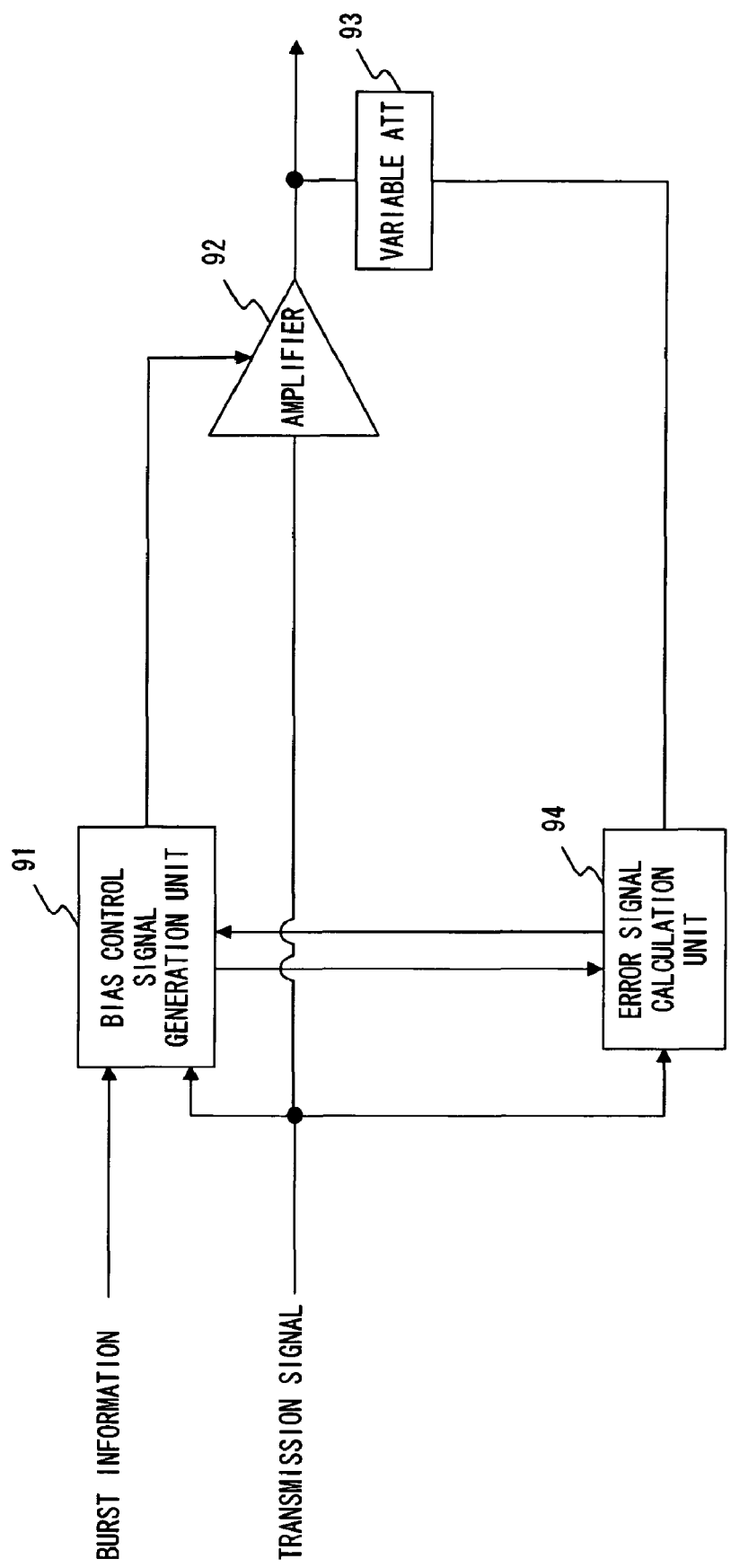
FIG. 25 shows an example of the circuit configuration of the embodiment 9 of the present invention.

FIG. 25 shows an example of the circuit configuration of the embodiment 9 of the present invention. The circuit of the present embodiment comprises a bias control signal generation unit 91, an amplifier 92, a variable ATT (variable attenuator) 93, and an error signal calculation unit 94

Figure 2:
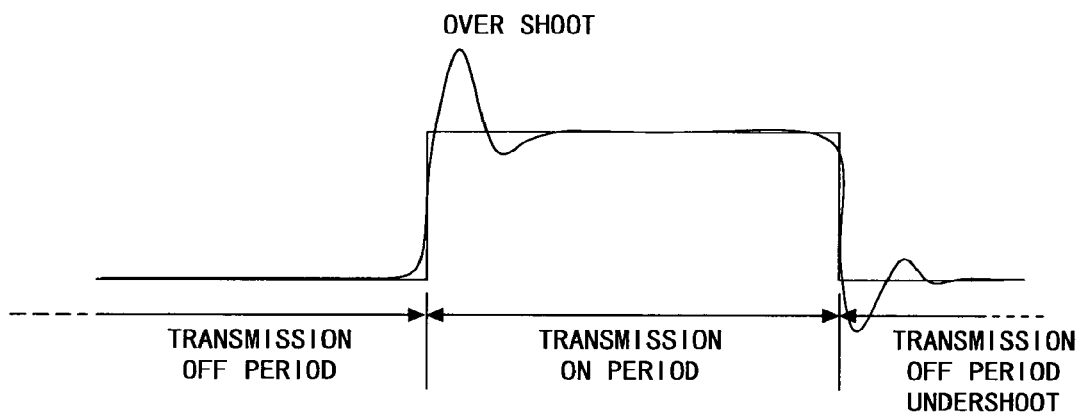
FIG. 2 shows an image of transient response of an amplifier power supply system generated when a TDD signal, etc. having a property of a burst is power-amplified by an amplifier.
Figure 3:
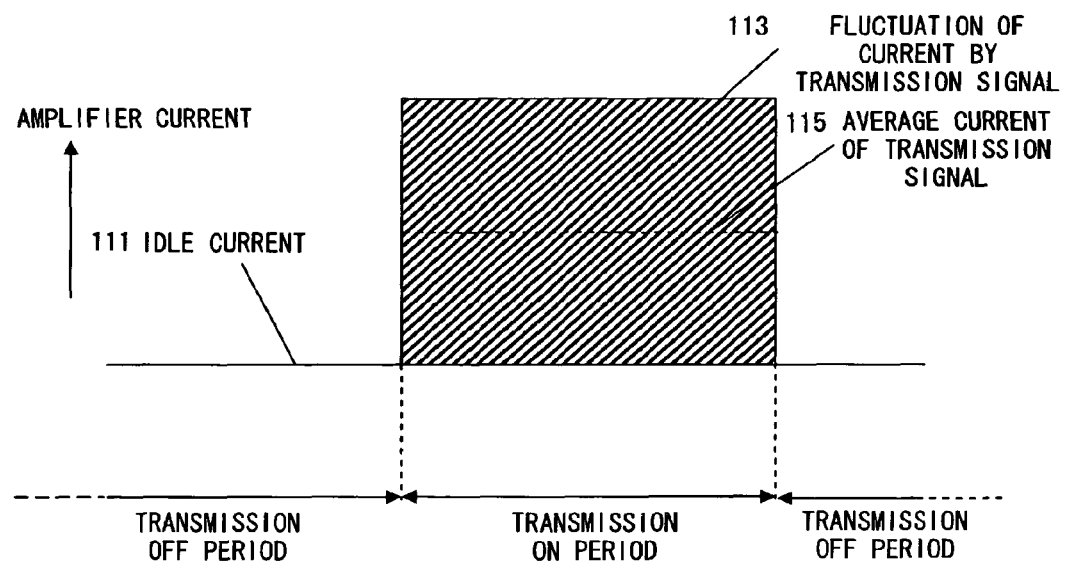
FIG. 3 shows a change of a current flowing through an amplifier when a transmission signal having a property of a burst is turned ON/OFF.

The bias control signal generation unit 91 controls the bias voltage to be applied to the amplifier 92, and suppresses the occurrence of the distortion of an output signal of the amplifier 92. The bias control signal generation unit 91 externally inputs the burst information and a transmission signal (burst signal), and detects the boost (transmission OFF→transmission ON) of the transmission signal input to the amplifier 92 according to the burst information. Upon detection of it, the unit outputs a signal to instruct the error signal calculation unit 94 to calculate an error signal. The burst information is similar to the burst information about the circuit shown in FIG. 2.

The amplifier 92 amplifies the transmission signal, and externally outputs the amplified signal to the variable ATT 93 and externally. The variable ATT 93 attenuates the output signal of the amplifier 92 to the level before the amplification, and outputs it to the error signal calculation unit 94. When the error signal calculation unit 94 inputs the directive signal from the bias control signal generation unit 91, it extracts and calculates the difference between the signals, that is, the amount of the distortion component (over shoot) of the output signal of the amplifier 92 generated at the boost of the transmission signal, according to the transmission signal and the signal input from the variable ATT 93. Then, the amount of distortion is output as an accumulation value of the error signal to the bias control signal generation unit 91.

The bias control signal generation unit 91 compares the error signal accumulation value input from the error signal calculation unit 94 with a threshold held in an internal register, memory, etc., and sets a control start timing of the optimum bias voltage to be applied to the amplifier 92 or an idle current of the amplifier 92. When the settings are completed, the completion signal is provided for the error signal calculation unit 94. Upon receipt of the completion signal, the error signal calculation unit 94 stops again the process until the directive signal is received from the bias control signal generation unit 91.

The bias control signal generation unit 91 and the error signal calculation unit 94 can be constituted by a hardware circuit, as a circuit for a software process by the execution by a microprocessor, or as a circuit constituted by a combination of a hardware circuit and a software processor.

First Example of the Configuration of the Bias Control Signal Generation Unit 91

The bias control signal generation unit 91 reduces the power consumption of the amplifier 92 by setting the bias voltage to be applied to the amplifier 92 such that the idle current at the transmission OFF of the amplifier 92 can be minimum value without the occurrence of transient response at the boost or attenuation of the transmission signal (refer to FIG. 7).

Figure 26:
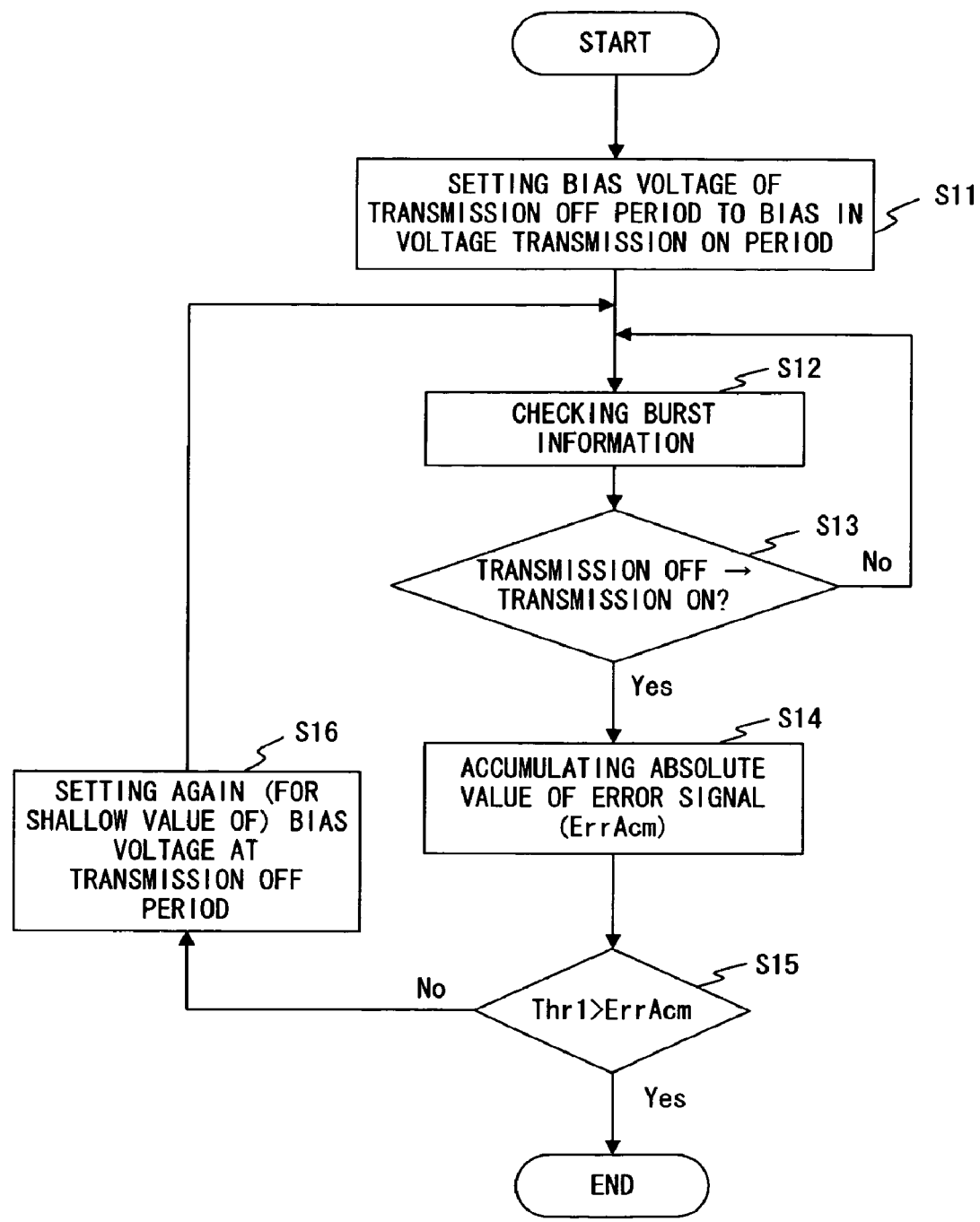
FIG. 26 shows the procedure of an example of the first configuration of the bias control signal generation unit according to the embodiment 9.

FIG. 26 shows the procedure of an example of the first configuration. The process of this flowchart is performed when a product is produced. A test signal having a property of a burst is input as a transmission signal to the bias control signal generation unit 91 and the error signal calculation unit 94.

The bias control signal generation unit 91 sets the bias voltage at the transmission OFF as the bias voltage at the transmission ON (S11). The bias control signal generation unit 91 checks the burst information (S12), and determines whether or not the transmission signal is boosted (transmission OFF transmission ON) (S13). If the boost is not detected, control is returned to step S12.

Thus, the bias control signal generation unit 91 repeats the processes in steps S12 to S13 until the boost of the transmission signal is detected.

When the bias control signal generation unit 91 detects the boost of the burst signal in step S13, it outputs the directive signal to the error signal calculation unit 94. When the error signal calculation unit 94 receives the directive signal, it obtains the difference (error signal) between the transmission signal input to the amplifier 92 and the signal input from the variable ATT 93 in a predetermined sampling cycle, accumulates (integrates) an absolute value of the error signal obtained at each sampling time, and outputs the error signal accumulation value (amount of distortion) ErrAcm to the bias control signal generation unit 91 (S14).

The bias control signal generation unit 91 compares the error signal accumulation value ErrAcm input from the error signal calculation unit 13 with a threshold Thr1, determines whether or not Thr1>ErrAcm (S15), resets the bias voltage at the transmission OFF unless Thr1>ErrAcm (S16), and control is returned to step S12. In step S16, the bias voltage is set to a value for a voltage lower by, for example, a predetermined value. If the bias voltage is negative, the absolute value is set lower by the predetermined value.

The processes in steps S12 through S16 are repeated until the bias control signal generation unit 91 determines in step S16 that Thr1>ErrAcm. When the bias control signal generation unit 91 determines Thr1>ErrAcm, the process of the flowchart terminates. The bias control signal generation unit 91 notifies the error signal calculation unit 14 of the completion signal after the processes.

Thus, the bias voltage is adjusted by performing the processes in steps S14 to S16 for each OFF→ON (boost) of the transmission signal having a property of a burst, and finally obtains a bias voltage for which the error signal accumulation value of the output signal of the amplifier 92 is less than the threshold Thr1.

Second Example of the Configuration of the Bias Control Signal Generation Unit 91

The bias control signal generation unit 91 delays the control start timing of the drain current of the amplifier 92 as much as possible to reduce the power consumption of the amplifier 92 and suppress the transient response of the output signal of the amplifier 92 at the boost/attenuation of the transmission signal (refer to FIG. 17). Therefore, the control start timing is set.

Figure 28:
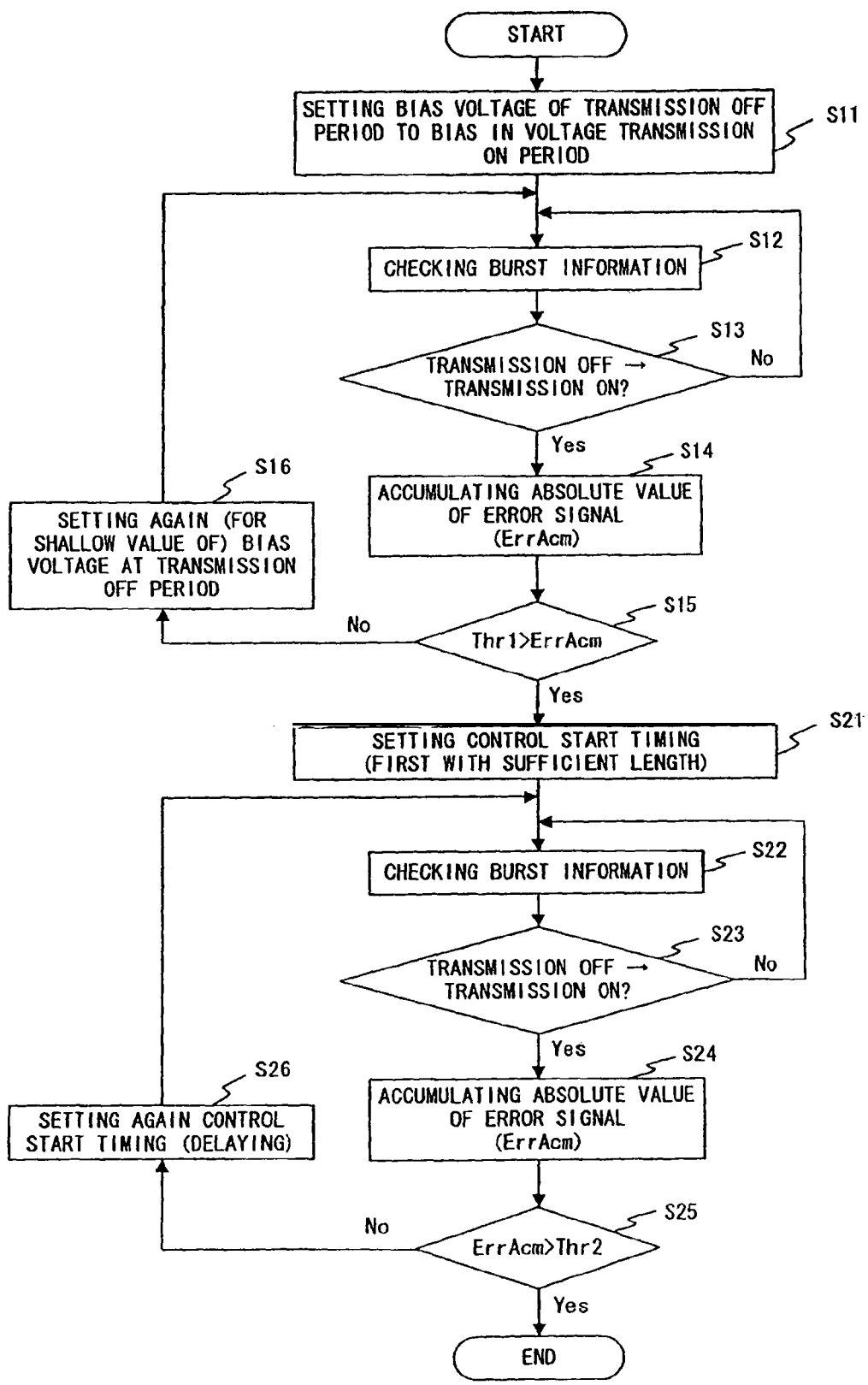
FIG. 28 shows the procedure of an example of the third configuration of the bias control signal generation unit according to the embodiment 9.

FIG. 28 shows the procedure of an example of the configuration. The process of the flowchart is performed when a product is produced. A test signal having a property of a burst is input as a transmission signal to the bias control signal generation unit 91 and the error signal calculation unit 14.

The bias control signal generation unit 91 sets control start timing or a drain current of the amplifier 92. The timing is set as having sufficient length (in time interval with the point of the ON status of the transmission signal (S21). The bias control signal generation unit 11 checks the burst information (S22), and determines whether or not the transmission signal has been boosted (transmission OFF→transmission ON) (S23). If the boost is not detected, control is returned to step S22.

Thus, the bias control signal generation unit 91 repeats the processes in steps S22 to S23 until the boost of the transmission signal is detected.

When the bias control signal generation unit 91 detects the boost of the burst signal in step S23, it outputs the directive signal to the error signal calculation unit 94. When the error signal calculation unit 94 receives the directive signal, it obtains a difference (error signal) between the transmission signal input to the amplifier 92 and the signal input from the variable ATT 93 in a predetermined sampling cycle, accumulates (integrates) an absolute value of the error signal obtained at each sampling time, and outputs the error signal accumulation value ErrAcm to the bias control signal generation unit 91 (S24).

The error signal calculation unit 14 obtains an error (error signal) between the transmission signal input to the amplifier 92 and the output signal of the amplifier 92 input through the hatch portion 13 in a predetermined sampling cycle, accumulates an absolute value of the error signal obtained at each sampling time, and outputs the error signal accumulation value ErrAcm to the bias control signal generation unit 91.

The bias control signal generation unit 91 compares the error signal accumulation value ErrAcm input from the hatch portion 13 with the threshold Thr2, determine whether or not Thr2>ErrAcm (S25), resets the control start timing of the amplifier 92 unless Thr2>ErrAcm (S26), thereby returning control to step S22. In step S26, the control start timing is set such that, for example, a delay by a predetermined time can be performed.

The processes in steps S22 to S26 are repeated until the bias control signal generation unit 91 determines Thr2>ErrAcm in step S25. If the bias control signal generation unit 91 determines Thr2>ErrAcm, the process of the flowchart terminates. After the termination of the process, the bias control signal generation unit 91 notifies the error signal calculation unit 14 of the completion signal.

Thus, each time the transmission signal having a property of a burst is boosted, the processes in steps S24 to S26 are performed, and the control start timing having the error signal accumulation value of the output signal of the amplifier 92 lower than the threshold Thr2 is determined when the switch is performed.

Third Example of the Configuration of the Bias Control Signal Generation Unit 91

The bias control signal generation unit 91 has the functions of both first and second examples of the configurations. That is, the bias voltage having the error signal accumulation value lower than the threshold Thr1 is set, and the control start timing having the error signal accumulation value lower than the threshold Thr2 is set.

Figure 27:
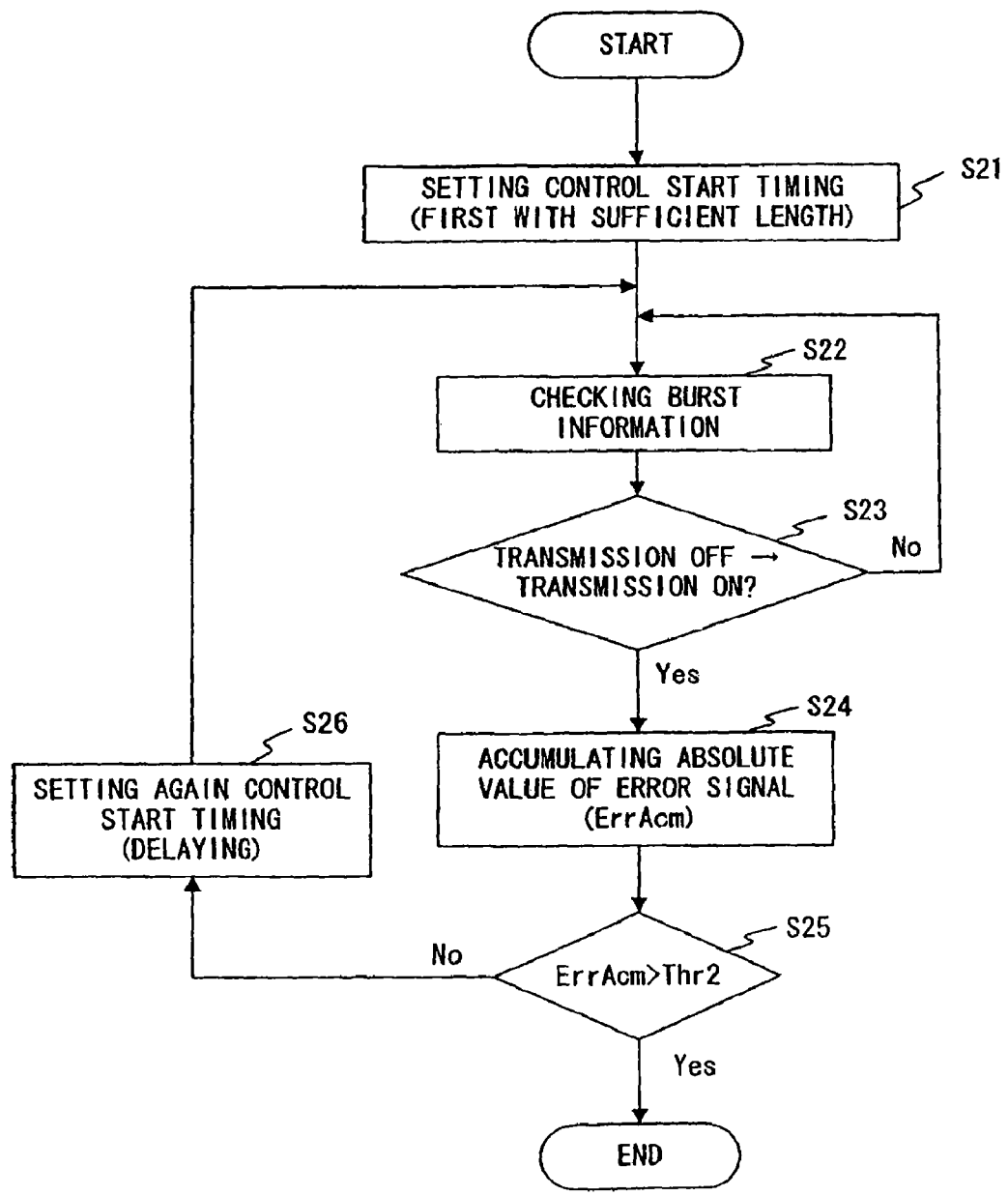
FIG. 27 shows the procedure of an example of the second configuration of the bias control signal generation unit according to the embodiment 9.
Figure 29:
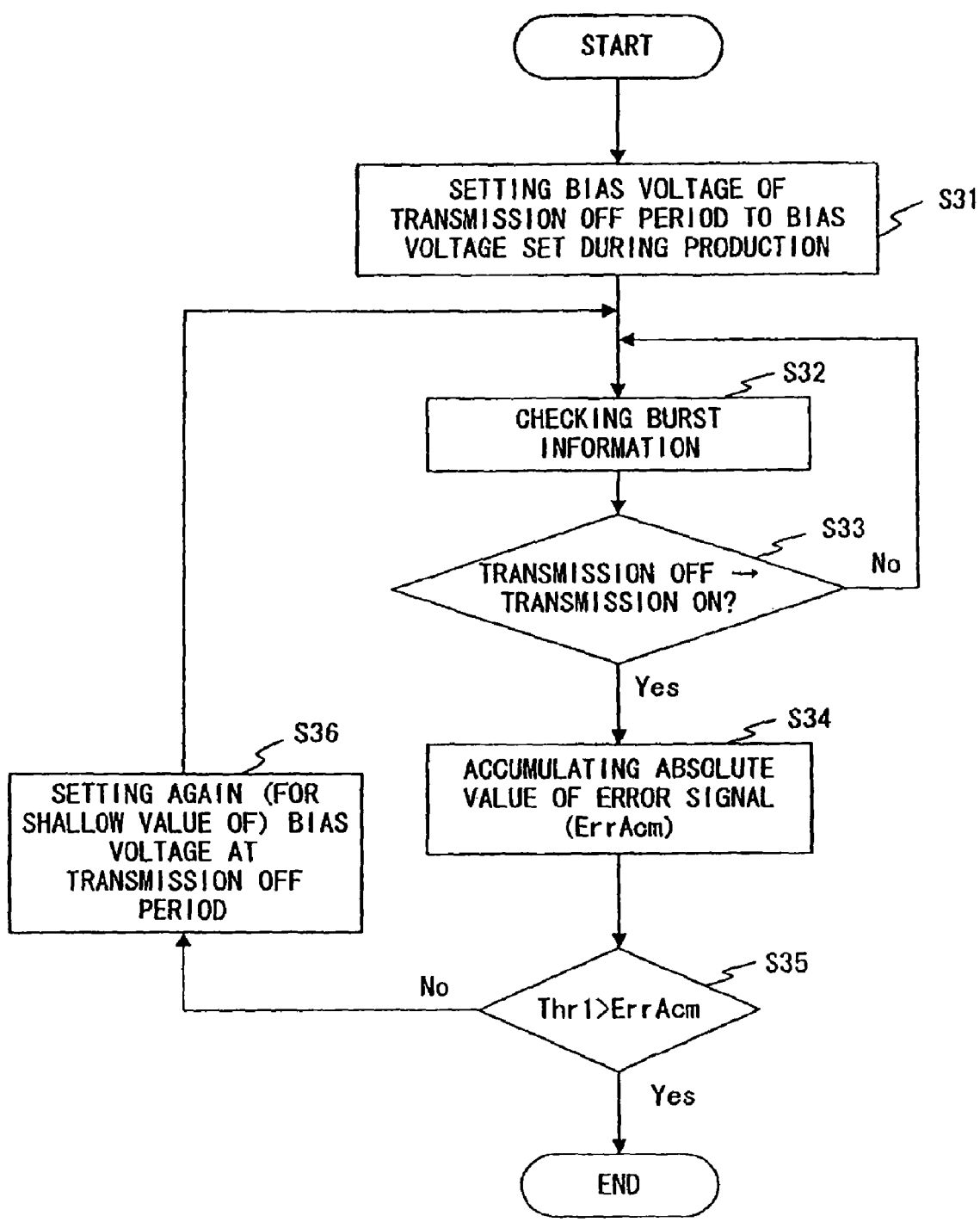
FIG. 29 shows the procedure of an example of the first configuration of the bias control signal generation unit according to the embodiment 10 of the present invention.

FIG. 29 is a flowchart of the procedure of the present configuration. In FIG. 29, the steps in the common processes between FIGS. 27 and 28 are assigned the same step numbers.

The bias control signal generation unit 91 performs the processes in steps S11 to S16, and sets the bias voltage (bias voltage having the error signal accumulation value lower than the threshold Thr1) to be applied to the amplifier 92. The bias control signal generation unit 91 then performs the processes in steps S22 to S26, and sets the control start timing of the idle current of the amplifier 92. When the process terminates, it notifies the error signal calculation unit 14 of the completion signal.

Embodiment 10

In the embodiment 9, the bias control signal generation unit 91 sets the bias voltage to be applied to the amplifier 92 or the control start timing of the drain current of the amplifier 92 when a product is produced. In the present embodiment, the bias control signal generation unit 91 sets the bias voltage and the control start timing when a product is operated. The configuration of the circuit according to the embodiment 10 is similar to that according to the embodiment 9.

First Example of the Configuration of the Bias Control Signal Generation Unit 91

FIG. 29 is a flowchart of the procedure according to the present configuration.

In the present configuration, the bias voltage at the transmission OFF is set to the bias voltage set during the production (S31). Afterwards, the processes in steps S32 to S36 similar to those in steps S12 to S16 are performed.

There is the possibility that the bias voltage set during production does not satisfy Thr1<ErrAcm due to a change in electric characteristic of the circuit by an operation environment after the production and delivery. In this case, by incorporating the process of the present configuration into a product, the bias voltage to be applied to the amplifier 92 can be set again and the distortion of the output signal of the amplifier 92 can be suppressed when the transmission signal is switched on and off, and the power consumption of the amplifier 92 can be reduced.

Second Example of the Configuration of the Bias Control Signal Generation Unit 91

Figure 30:
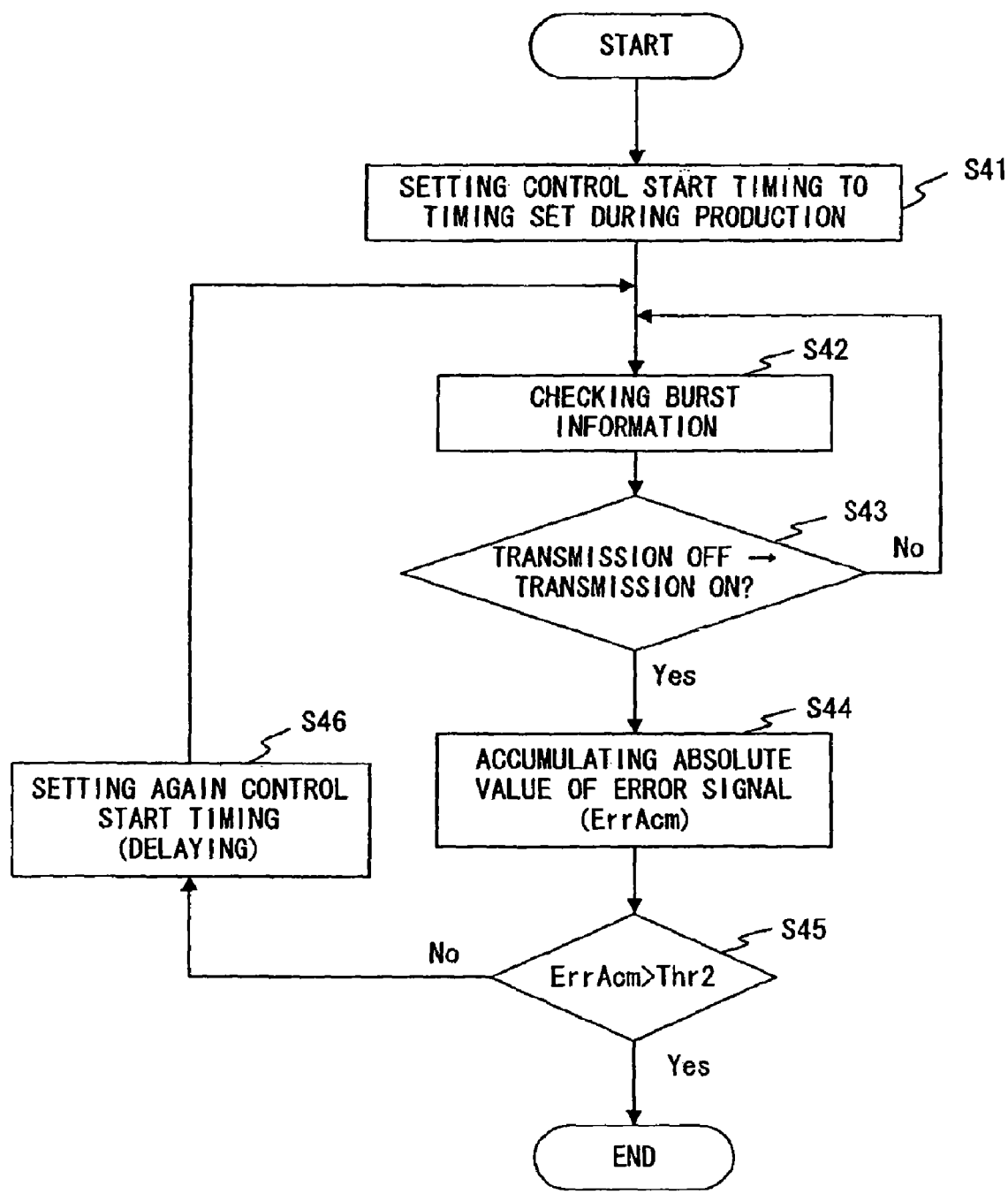
FIG. 30 shows the procedure of an example of the second configuration of the bias control signal generation unit according to the embodiment 10.

FIG. 30 is a flowchart of the procedure of the present configuration.

In the present configuration, first, the control start timing of the drain current of the amplifier 92 is set to the timing set during production (S41). Afterwards, the processes in steps S42 to S46 similar to those in steps S22 to S26 according to the second configuration example of the embodiment 9 are performed.

There can be the case where the control start timing set during production does not satisfy Thr2>ErrAcm due to a change in electric characteristic of a circuit by an operation environment, etc. after production or delivery. In this case, by incorporating the process of the present configuration into a product, the control start timing of the drain current of the amplifier 92 can be set again, an occurrence of the distortion of the output signal of the amplifier 92 can be suppressed at the ON/OFF switch of a transmission signal, and the power consumption of the amplifier 92 can be reduced.

Third Example of the Configuration of the Bias Control Signal Generation Unit 91

FIG. 31 is a flowchart for explanation of the procedure of the present configuration.

In the present configuration, the bias voltage at the transmission OFF is set to the bias voltage set during production (S51). Afterwards, the processes in steps S52 to S54 similar to those in steps S12 to S16 according to the first configuration example of the embodiment 9 are performed. Thus, the bias voltage at the transmission OFF set during production is set again.

Then, the control start timing of the drain current of the amplifier 92 is set to the control start timing set during production (S61). Afterwards, the processes in steps S62 to S66 similar to those in steps S22 to S26 according to the second configuration example of the embodiment 9 are performed. Thus, the control start timing of the drain current of the amplifier 92 set during production is set again.

As described above, although the bias voltage and the control start timing are inappropriate for any factor after the delivery of a product, they can be set again and the occurrence of a distortion of the output signal of the amplifier 92 at the ON/OFF switch of the transmission signal can be suppressed, and the power consumption of the amplifier 92 can be reduced.

In the above-mentioned embodiments 9 and 10, the amount of distortion (over shoot) when the transmission signal is boosted is obtained as an error signal accumulation value, and then the value is compared with a threshold, thereby obtaining an appropriate bias voltage to be applied to the amplifier 92. However, it is also possible to obtain an appropriate bias voltage to be, applied to the amplifier 92 by comparing the amount of distortion (under shoot) at the attenuation (transmission signal ON→transmission OFF) of a transmission signal as an error signal accumulation value with a threshold.

Thus, in the embodiments 9 and 10, the output signal of the amplifier 92 is fed back, the output signal is attenuated to the level before the amplification, the attenuated output signal is compared with the transmission signal before the attenuation, the difference between the signals is obtained, and the difference is calculated as the amount of distortion (error signal accumulation value). Then, feedback control is performed such that the error signal accumulation value is lower than a predetermined threshold, and the bias voltage to be applied to the amplifier 92 is adjusted, thereby suppressing the occurrence of a distortion of the output signal of the amplifier 92 at the attenuation or boost of the transmission signal.

EXAMPLE OF VARIATION

The above-mentioned embodiments are the present invention applied to an amplifier constituted by the FET. The present invention is not limited to this application, but also can be applied to an amplifier constituted by other semiconductor elements such as bipolar transistors, etc.

What is claimed is:

1. An amplifier control device which receives and amplifies a transmission signal having a property of a burst, comprising:
    an attenuation device which attenuates an output signal of the amplifier to a level before amplification and which outputs the signal;
    an error signal accumulation value calculation device which starts calculating a difference between the transmission signal and a signal output from the attenuation device, as an error signal accumulation value, when a transmission signal input to the amplifier rises from OFF to ON; and
    a bias control device which controls a bias voltage to be applied to the amplifier based on the error signal accumulation value calculated by the error signal accumulation value calculation device and which sets a start timing of the bias voltage based on the error signal accumulation value, wherein
    the bias control device reports a completion of setting of the start timing to the error signal accumulation value calculation device when the bias control device completes the setting, and
    the error signal accumulation value calculation device stops the calculation when the error signal accumulation value calculation device receives the report from the bias control device.

2. The device according to claim 1, wherein
    the bias control device controls a value of a bias voltage to be applied to the amplifier such that a value of an idle current of the amplifier when the transmission signal is in an OFF status can be a minimum value at which no transient response occurs in the amplifier.

3. The device according to claim 2, wherein
    the bias control device performs control such that a control termination timing of a bias voltage to be applied to the amplifier can be an earliest possible timing with which no transient response occurs in the amplifier.

4. The device according to claim 1, wherein
    the bias control device performs control such that a control termination timing of a bias voltage to be applied to the amplifier can be a latest possible timing with which no transient response occurs in the amplifier.

5. An amplifier control device which receives and amplifies a transmission signal having a property of a burst, comprising:
    an attenuation device which attenuates an output signal of the amplifier to a level before amplification and which outputs the signal;
    an error signal accumulation value calculation device which starts calculating a difference between the transmission signal and a signal output from the attenuation device, as an error signal accumulation value, when a transmission signal input to the amplifier falls from ON to OFF; and a bias control device which controls a bias voltage to be applied to the amplifier based on the error signal accumulation value calculated by the error signal accumulation value calculation device and which sets a start timing of the bias voltage based on the error signal accumulation value, wherein the bias control device reports a completion of a setting of the start timing to the error signal accumulation value calculation device when the bias control device completes the setting, and the error signal accumulation value calculation device stops the calculation when the error signal accumulation value calculation device receives the report from the bias control device.

* * * * *